US011678486B2

(12) United States Patent
Lue et al.

(10) Patent No.: US 11,678,486 B2
(45) Date of Patent: *Jun. 13, 2023

(54) 3D FLASH MEMORY WITH ANNULAR CHANNEL STRUCTURE AND ARRAY LAYOUT THEREOF

(71) Applicant: MACRONIX International Co., Ltd., Hsinchu (TW)

(72) Inventors: Hang-Ting Lue, Hsinchu (TW); Wei-Chen Chen, Taoyuan (TW); Teng Hao Yeh, Hsinchu County (TW); Guan-Ru Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/784,167

(22) Filed: Feb. 6, 2020

(65) Prior Publication Data

US 2020/0381450 A1    Dec. 3, 2020

Related U.S. Application Data

(60) Provisional application No. 62/856,158, filed on Jun. 3, 2019.

(51) Int. Cl.
*H01L 27/11582*    (2017.01)
*H01L 27/11565*    (2017.01)
(Continued)

(52) U.S. Cl.
CPC ...... *H01L 27/11582* (2013.01); *H01L 23/528* (2013.01); *H01L 27/11565* (2013.01);
(Continued)

(58) Field of Classification Search
CPC .................. H01L 27/11519–11597
See application file for complete search history.

(56) References Cited

U.S. PATENT DOCUMENTS 8,223,548 B2   7/2012  Hayashi et al.
8,432,719 B2   4/2013  Lue
(Continued)

FOREIGN PATENT DOCUMENTS

CN    101689547    3/2010
CN    109037231    12/2018
(Continued)

OTHER PUBLICATIONS

Pei-Ying Du, et al., "Pulse-IV Characterization of Charge-Transient Behavior of SONOS-Type Devices With or Without a Thin Tunnel Oxide," IEEE Electron Device Letters, vol. 30, Apr. 2009, pp. 380-382.
(Continued)

*Primary Examiner* — Didarul A Mazumder
*Assistant Examiner* — Gustavo G Ramallo
(74) *Attorney, Agent, or Firm* — J.C. Patents

(57) ABSTRACT

Provided are a 3D flash memory and an array layout thereof. The 3D flash memory includes a gate stack structure, a annular channel pillar, a first source/drain pillar, a second source/drain pillar and a charge storage structure. The gate stack structure is disposed on a dielectric base and includes a plurality of gate layers electrically insulated from each other. The annular channel pillar is disposed on the dielectric base and penetrates through the gate stack structure. The first source/drain pillar and the second source/drain pillar are disposed on the dielectric base, are located within the channel pillar and penetrate through the gate stack structure. The first source/drain pillar and the second source/drain pillar are separated from each other and are each connected to the channel pillar. The charge storage structure is disposed between each of the plurality of gate layers and the channel pillar.

19 Claims, 21 Drawing Sheets

(51) Int. Cl.
*H01L 23/528* (2006.01)
*H01L 21/02* (2006.01)
*H01L 21/311* (2006.01)
*H01L 29/51* (2006.01)
*H01L 21/306* (2006.01)
*H01L 21/28* (2006.01)

(52) U.S. Cl.
CPC .... *H01L 21/0217* (2013.01); *H01L 21/02164* (2013.01); *H01L 21/02271* (2013.01); *H01L 21/02532* (2013.01); *H01L 21/02595* (2013.01); *H01L 21/30604* (2013.01); *H01L 21/31111* (2013.01); *H01L 29/40117* (2019.08); *H01L 29/513* (2013.01); *H01L 29/518* (2013.01)

(56) References Cited

U.S. PATENT DOCUMENTS

| | | |
|---|---|---|
| 8,488,387 B2 | 7/2013 | Lue et al. |
| 8,630,114 B2 | 1/2014 | Lue |
| 8,824,212 B2 | 9/2014 | Lue |
| 9,281,044 B2 | 3/2016 | Ramaswamy et al. |
| 9,337,210 B2 | 5/2016 | Karda et al. |
| 9,425,324 B2 | 8/2016 | Diaz et al. |
| 9,748,264 B1 | 8/2017 | Jiang et al. |
| 9,837,435 B1 | 12/2017 | Chang et al. |
| 9,929,177 B2 | 3/2018 | Nagumo |
| 10,096,619 B2 | 10/2018 | Ino et al. |
| 10,157,671 B1 | 12/2018 | Lung et al. |
| 10,381,375 B2 | 8/2019 | Choi |
| 10,403,631 B1 | 9/2019 | Lu et al. |
| 10,553,606 B2 | 2/2020 | Kim et al. |
| 10,734,409 B2 | 8/2020 | Yoo |
| 2003/0022500 A1* | 1/2003 | Tang ............... H01L 27/115 438/692 |
| 2005/0199945 A1* | 9/2005 | Kodama ........... H01L 29/7845 257/324 |
| 2007/0236979 A1 | 10/2007 | Takashima |
| 2010/0244119 A1* | 9/2010 | Fukuzumi ............ H01L 29/16 257/E21.423 |
| 2011/0298013 A1* | 12/2011 | Hwang ............... G11C 16/26 257/208 |
| 2015/0070964 A1 | 3/2015 | Yamada et al. |
| 2015/0318301 A1 | 11/2015 | Lee et al. |
| 2017/0148517 A1* | 5/2017 | Harari ............... G11C 16/0491 |
| 2017/0263629 A1 | 9/2017 | Sekine |
| 2019/0067318 A1 | 2/2019 | Shioda et al. |
| 2019/0088675 A1 | 3/2019 | Itokawa et al. |
| 2019/0157295 A1 | 5/2019 | Kariya |
| 2020/0203381 A1 | 6/2020 | Rabkin et al. |
| 2020/0381450 A1 | 12/2020 | Lue et al. |
| 2021/0375919 A1 | 12/2021 | Wang et al. |

FOREIGN PATENT DOCUMENTS

| | | |
|---|---|---|
| CN | 109309097 | 2/2019 |
| CN | 109712983 | 5/2019 |
| CN | 110071117 | 7/2019 |
| TW | 201613090 | 4/2016 |
| TW | I530946 | 4/2016 |
| TW | 201639149 | 11/2016 |
| TW | I560885 | 12/2016 |
| TW | I624007 | 5/2018 |
| TW | 201909390 | 3/2019 |
| TW | I718077 | 2/2021 |

OTHER PUBLICATIONS

Hang-Ting Lue, et al., "Radically Extending the Cycling Endurance of Flash Memory (to > 100M Cycles) by Using Built-in Thermal Annealing to Self-heal the Stress-induced Damage," 2012 International Electron Devices Meeting, Dec. 2012, pp. 1-4.

Office Action of Taiwan Counterpart Application, dated Mar. 25, 2021, pp. 1-13.

Office Action of Taiwan Counterpart Application, dated Mar. 25, 2021, pp. 1-6.

Hang-Ting Lue et al., "Device Modeling of Ferroelectric Memory Field-Effect Transistor (FeMFET)", IEEE Transactions on Electron Devices, Oct. 2002, pp. 1790-1798.

Halid Mulaosmanovic et al., "Ferroelectric FETs With 20-nm-Thick HfO2 Layer for Large Memory Window and High Performance", IEEE Transactions on Electron Devices, Sep. 2019, pp. 1-6.

\* cited by examiner

3D FLASH MEMORY WITH ANNULAR CHANNEL STRUCTURE AND ARRAY LAYOUT THEREOF

CROSS-REFERENCE TO RELATED APPLICATION

This application claims the priority benefit of U.S. provisional application Ser. No. 62/856,158, filed on Jun. 3, 2019. The entirety of the above-mentioned patent application is hereby incorporated by reference herein and made a part of this specification.

BACKGROUND OF THE INVENTION

1. Field of the Invention

The invention relates to a 3D flash memory and an array layout thereof, and in particular to, a 3D flash memory and an array layout thereof.

2. Description of Related Art

A non-volatile memory (such as a flash memory) is a memory widely used in personal computers and other electronic devices because it has an advantage that the stored data does not disappear after being powered off.

The 3D flash memory currently used in the industry includes a NOR flash memory and a NAND type flash memory. In addition, another type of 3D flash memory is an AND type flash memory, which can be applied to a multi-dimensional flash memory array with high integration and high area utilization, and has an advantage of fast operation speed. Therefore, the development of the 3D flash memory has gradually become the current trend.

SUMMARY OF THE INVENTION

The invention provides a 3D flash memory, where a annular channel pillar is disposed in a gate stack structure, and two source/drain pillars are disposed in the channel pillar and connected to the channel pillar.

The invention provides an array layout of a 3D flash memory, which includes the foregoing 3D flash memory.

The 3D flash memory of the invention includes a gate stack structure, a annular channel pillar, a first source/drain pillar, a second source/drain pillar, and a charge storage structure. The gate stack structure is disposed on the dielectric base and includes a plurality of gate layers electrically insulated from each other. The annular channel pillar is disposed on the dielectric base and penetrates the gate stack structure. The first source/drain pillar and the second source/drain pillar are disposed on the dielectric base, are located within the channel pillar, and penetrate through the gate stack structure, where the first source/drain pillar and the second source/drain pillar are separated from each other and are each connected to the channel pillar. The charge storage structure is disposed between each of the plurality of gate layers and the channel pillar.

In an embodiment of the 3D flash memory of the invention, an insulating pillar is disposed between the first source/drain pillar and the second source/drain pillar.

In an embodiment of the 3D flash memory of the invention, the first source/drain pillar and the second source/drain pillar each include a central portion and a peripheral portion surrounding the central portion, and a doping concentration of the central portion is greater than that of the peripheral portion.

In an embodiment of the 3D flash memory of the invention, the first source/drain pillar and the second source/drain pillar each include a central portion and a peripheral portion surrounding the central portion, and the central portion includes a metal silicide layer.

In an embodiment of the 3D flash memory of the invention, the 3D flash memory further includes a first buried pillar and a second buried pillar that are disposed on the dielectric base, where the first buried pillar is connected to the first source/drain pillar, and the second buried pillar is connected to the second source/drain pillar.

In an embodiment of the 3D flash memory of the invention, the charge storage structure covers an upper surface and a lower surface of each of the plurality of gate layers.

In an embodiment of the 3D flash memory of the invention, the charge storage structure covers an outer surface of the channel pillar.

In an embodiment of the 3D flash memory of the invention, the channel pillar is continuous in a direction in which the channel pillar extends.

In an embodiment of the 3D flash memory of the invention, the channel pillar is discontinuous in a direction in which the channel pillar extends, and the channel pillar corresponds only to a location of each of the plurality of gate layers.

In an embodiment of the 3D flash memory of the invention, the channel pillar comprises a plurality of portions sequentially arranging in the extending direction of the channel pillar and not contacting with each other, and the plurality of portions each correspond to a position of one of the plurality of gate layers.

In an embodiment of the 3D flash memory of the invention, the 3D flash memory further includes a first transistor and a second transistor, where the first transistor is electrically connected to the first source/drain pillar, and the second transistor is electrically connected to the second source/drain pillar.

In an embodiment of the 3D flash memory of the invention, the first transistor and the second transistor are composed of a transistor gate layer, a first transistor channel pillar, a second transistor channel pillar, a first gate insulating layer, and a second gate insulating layer. The transistor gate layer is stacked on the gate stack structure and electrically insulated from the gate stack structure. The first transistor channel pillar penetrates through the transistor gate layer and is connected to the first source/drain pillar. The second transistor channel pillar penetrates through the transistor gate layer and is connected to the second source/drain pillar. The first gate insulating layer is disposed between the first transistor channel pillar and the transistor gate layer. The second gate insulating layer is disposed between the second transistor channel pillar and the transistor gate layer. One end of the first transistor channel pillar opposite to the first source/drain pillar has a first doped region. One end of the second transistor channel pillar opposite to the second source/drain pillar has a second doped region.

In an embodiment of the 3D flash memory of the invention, charges are locally trapped in the charge storage structure adjacent to the first source/drain pillar and/or the second source/drain pillar.

In an embodiment of the 3D flash memory of the invention, a plurality of the 3D flash memories are stacked with each other, and the first source/drain pillar of the upper 3D flash memory is connected to the first source/drain pillar of the lower 3D flash memory, and the second source/drain pillar of the upper 3D flash memory is connected to the second source/drain pillar of the lower 3D flash memory.

In an embodiment of the 3D flash memory of the invention, trenches are arranged in parallel at opposite sides of the gate stack structure, and from a top view direction, a connection line between the first source/drain pillar and the second source/drain pillar is parallel or perpendicular to the extending direction of the trenches.

In an embodiment of the 3D flash memory of the invention, trenches are arranged in parallel at opposite sides of the gate stack structure, and from a top view direction, an acute angle is formed between a connection line between the first source/drain pillar and the second source/drain pillar and the extending direction of the trenches.

In an embodiment of the 3D flash memory of the invention, the 3D flash memory further includes a conductive layer disposed on the dielectric base and adjacent to at least one side wall of the gate stack structure, wherein the conductive layer extends along the at least one side wall of the gate stack structure, and each of two opposite end portions of the conductive layer has an electrical connection point in an extending direction of the conductive layer.

The array layout of the 3D flash memory of the invention includes a plurality of 3D flash memories, a plurality of circuit patterns, and a plurality of conductive lines. The plurality of 3D flash memories are arranged on the dielectric base in an array. The plurality of circuit patterns are each electrically connected to one of the first source/drain pillar and the second source/drain pillar that are of the plurality of 3D flash memories. The plurality of conductive lines are each electrically connected to a corresponding one of the plurality of circuit patterns via a contact, where the plurality of conductive lines are arranged parallel to each other.

In an embodiment of the array layout of the 3D flash memory of the invention, each of the plurality of circuit patterns includes a first portion extending along a row direction of the array and a second portion extending along a column direction of the array. The first portion is connected to one of the first source/drain pillar and the second source/drain pillar. The contact is disposed on the second portion, and the plurality of conductive lines extend along the column direction.

In an embodiment of the array layout of the 3D flash memory of the invention, the plurality of conductive lines comprises source lines or bit lines.

Based on the foregoing, in the 3D flash memory of the invention, the annular channel pillar is disposed in the gate stack structure, and two source/drain pillars are disposed in the channel pillar and connected to the channel pillar. In this way, the 3D flash memory of the invention may have high integration and high area utilization, and meets the requirement of fast operation speed.

To make the features and advantages of the invention clear and easy to understand, the following gives a detailed description of embodiments with reference to accompanying drawings.

DESCRIPTION OF THE EMBODIMENTS

FIG. 1A to FIG. 1E are schematic top views of a manufacturing process of a 3D flash memory according to a first embodiment of the invention. FIG. 2A to FIG. 2E are schematic cross-sectional views of a manufacturing process of a 3D flash memory taken along line A-A' in FIG. 1A to FIG. 1E.

Figure 1A:
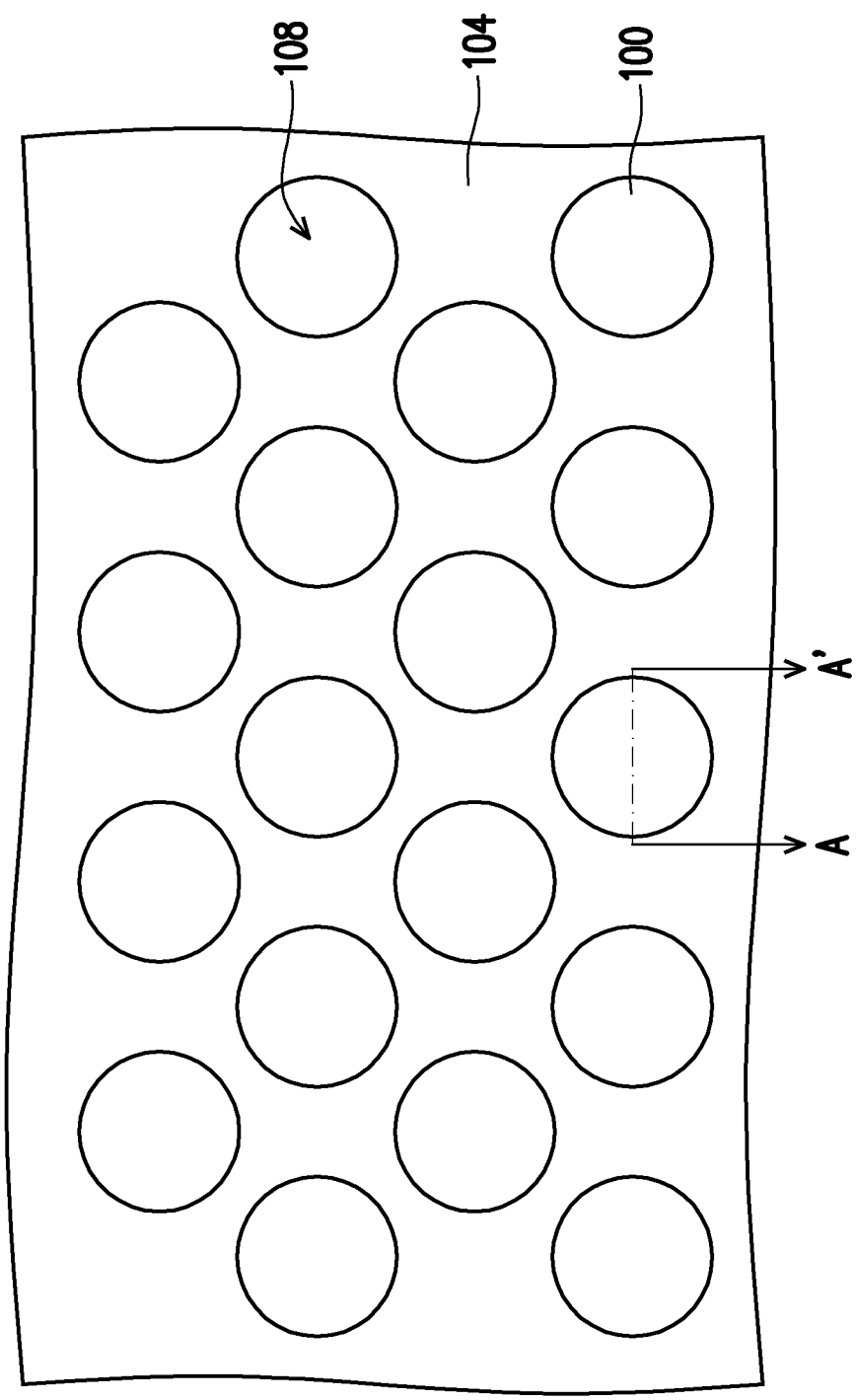
FIG. 1A to FIG. 1E are schematic top views of a manufacturing process of a 3D flash memory according to a first embodiment of the invention.
Figure 2A:
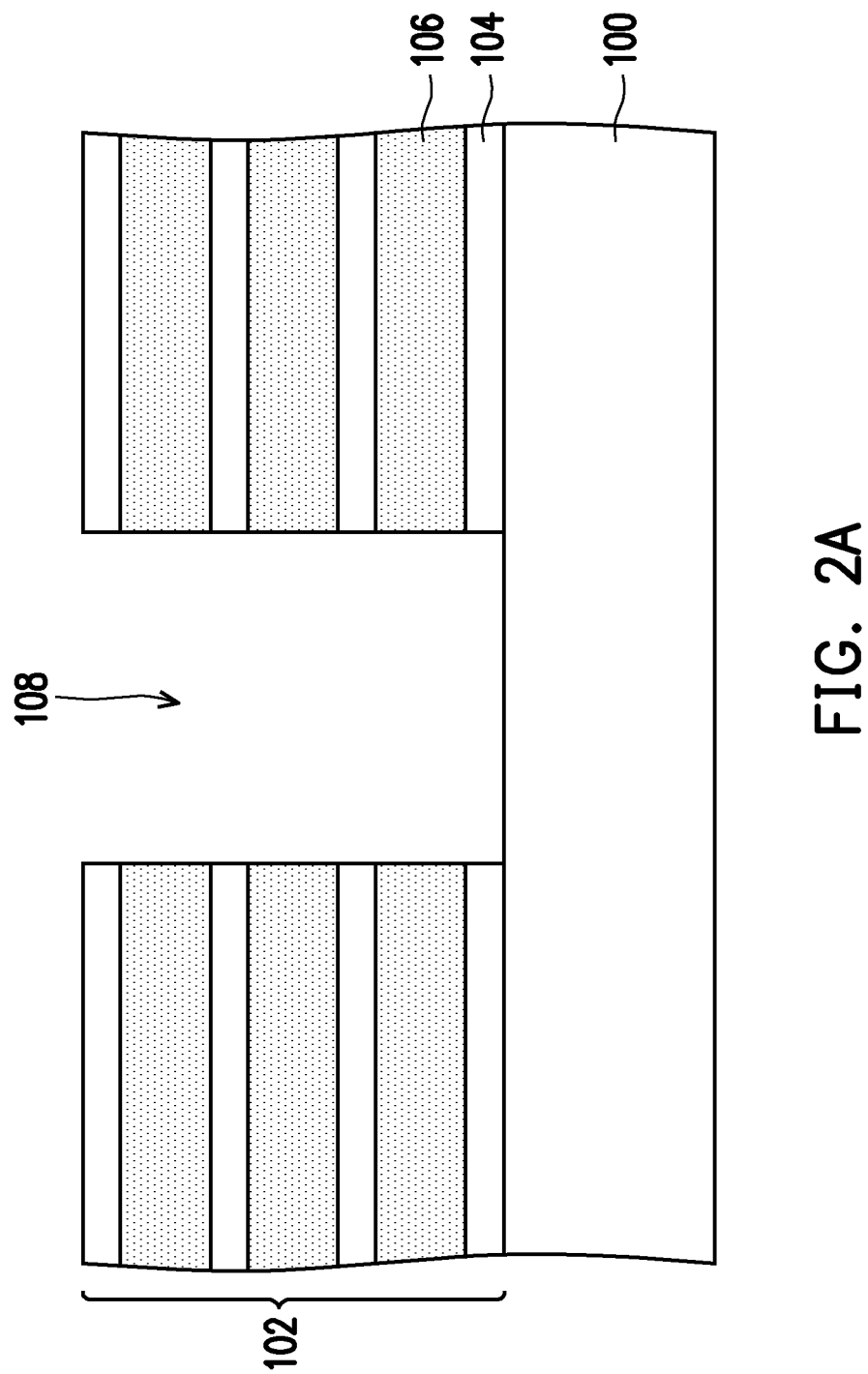
FIG. 2A to FIG. 2E are schematic cross-sectional views of a manufacturing process of a 3D flash memory taken along line A-A' in FIG. 1A to FIG. 1E.

First, referring to both FIG. 1A and FIG. 2A, a stack structure 102 is formed on a dielectric base 100. The dielectric base 100 is, for example, a dielectric layer such as a silicon oxide layer that is formed on a silicon substrate. In the present embodiment, the stack structure 102 is composed of an insulating layer 104 and a sacrificial layer 106 that are sequentially stacked on the dielectric base 100. In other embodiments, the stack structure 102 may be composed of the sacrificial layer 106 and the insulating layer 104 that are sequentially and alternately stacked on the dielectric base 100. In addition, in the present embodiment, an uppermost layer of the stack structure 102 is the insulating layer 104. The insulating layer 104 is, for example, a silicon oxide layer. The sacrificial layer 106 is, for example, a silicon nitride layer. In the present embodiment, the stack structure 102 has four insulating layers 104 and three sacrificial layers 106, but the invention is not limited thereto. In other embodiments, more insulating layers 104 and more sacrificial layers 106 may be formed according to actual requirements.

Next, an opening 108 is formed in the stack structure 102. In the present embodiment, the opening 108 exposes the dielectric base 100, but the invention is not limited thereto. In other embodiments, when a lowermost layer of the stack structure 102 is the insulating layer 104, a bottom of the opening 108 may be located in the lowermost insulating layer 104, that is, the opening 108 does not expose the dielectric base 100. Alternatively, in other embodiments, the bottom of the opening 108 may be located in the dielectric base 100. In the present embodiment, the opening 108 has a circular profile from a top view, but the invention is not limited thereto. In other embodiments, the opening 108 may have profiles of other shapes such as a polygon.

Figure 1B:
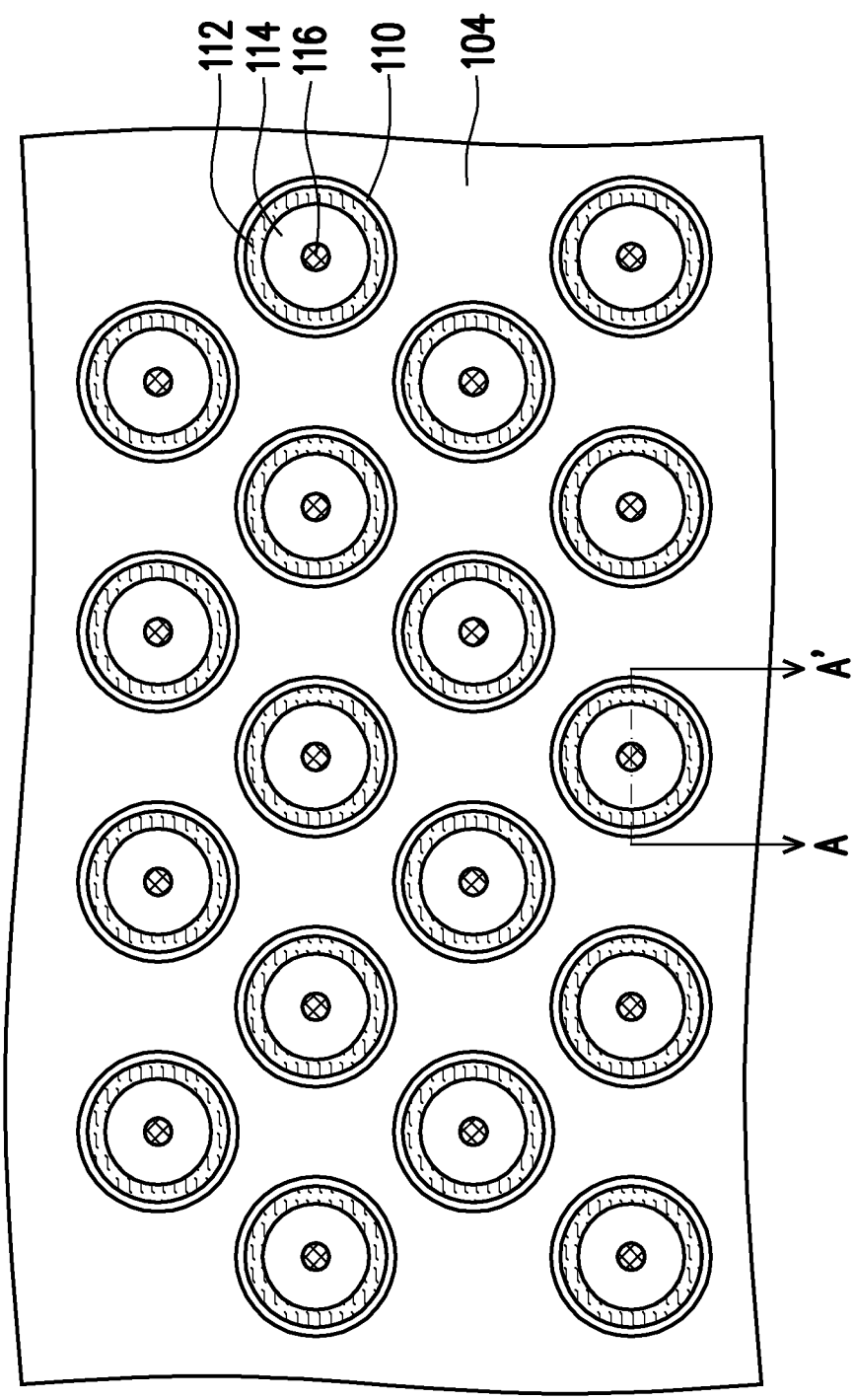
Figure 2B:
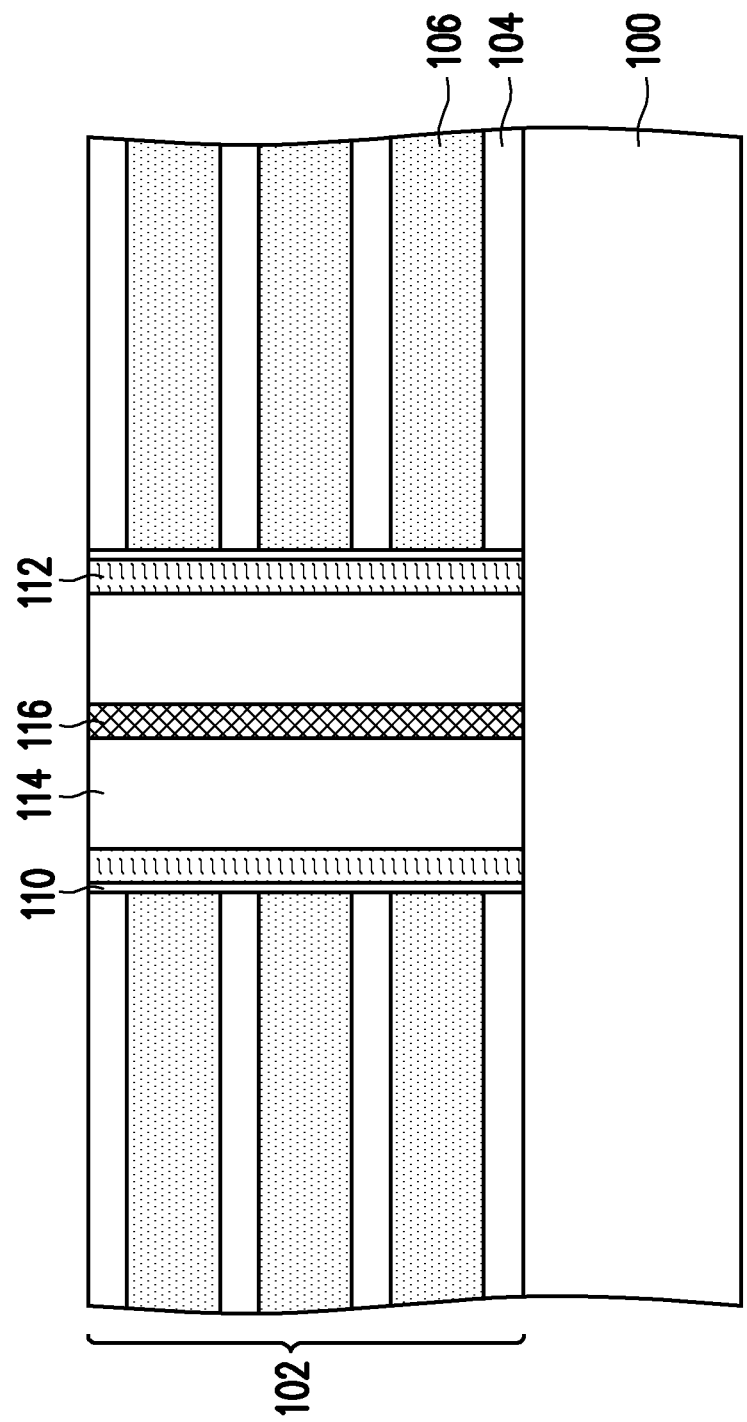

Afterwards, referring to both FIG. 1B and FIG. 2B, a charge storage structure 110 is formed on an inner surface of the opening 108. In the present embodiment, the charge storage structure 110 is, for example, composed of a silicon oxide layer, a silicon nitride layer, and a silicon oxide layer that are sequentially stacked. A method for forming the charge storage structure 110 is, for example, forming the silicon oxide layer, the silicon nitride layer, and the silicon oxide layer sequentially on a top face of an uppermost insulating layer 104, the inner surface and the bottom of the opening 108, and then performing an anisotropic etching process to remove the silicon oxide layer and the silicon nitride layer on the insulating layer 104 and the bottom of the opening 108. Next, a channel layer 112 is formed on the charge storage structure 110. The channel layer 112 is, for example, an undoped polysilicon layer. A method for forming the channel layer 112 is, for example, forming a channel material layer on a top face of an uppermost insulating layer 104 and the inner surface and the bottom of the opening 108, and then performing an anisotropic etching process to remove the channel material layer on the insulating layer 104 and the bottom of the opening 108. In the present embodiment, because the channel layer 112 is formed on the inner surface of the opening 108, the channel layer 112 may be deemed as a annular channel pillar, and the channel layer 112 is continuous in a direction (between the top and bottom of the opening 108) in which the channel layer 112 extends. "The channel layer 112 is continuous in a direction in which the channel layer 112 extends" means that the channel layer 112 is integral in its extending direction and is not divided into a plurality of disconnected portions. In the present embodiment, since the opening 108 has a circular profile from a top view, the channel pillar also has a circular profile from a top view, but the invention is not limited thereto. In other embodiments, depending on the shape of the opening 108, the channel pillar may have profiles of other shapes such as a polygon from a top view. In addition, the charge storage structure 110 is located between the channel layer 112 and the inner surface of the opening 108, and therefore covers an outer surface of the channel pillar (the channel layer 112).

Next, an insulating layer 114 is formed in the opening 108. The insulating layer 114 is, for example, a silicon oxide layer. A method for forming the insulating layer 114 is, for example, performing a chemical vapor deposition process. Importantly, the insulating layer 114 does not fill the opening 108, but retains a central portion of the opening 108. Afterwards, an insulating layer 116 is formed in the opening 108 to fill the central portion of the opening 108. In the present embodiment, the insulating layer 116 may be deemed as an insulating pillar. The insulating layer 116 is, for example, a silicon nitride layer. A method for forming the insulating layer 116 is, for example, performing a chemical vapor deposition process. In other embodiments, the opening 108 is filled with the insulating layer 114, then an opening that exposes the dielectric base 100 is formed in the insulating layer 114, and the opening is filled with the insulating layer 116.

Figure 1C:
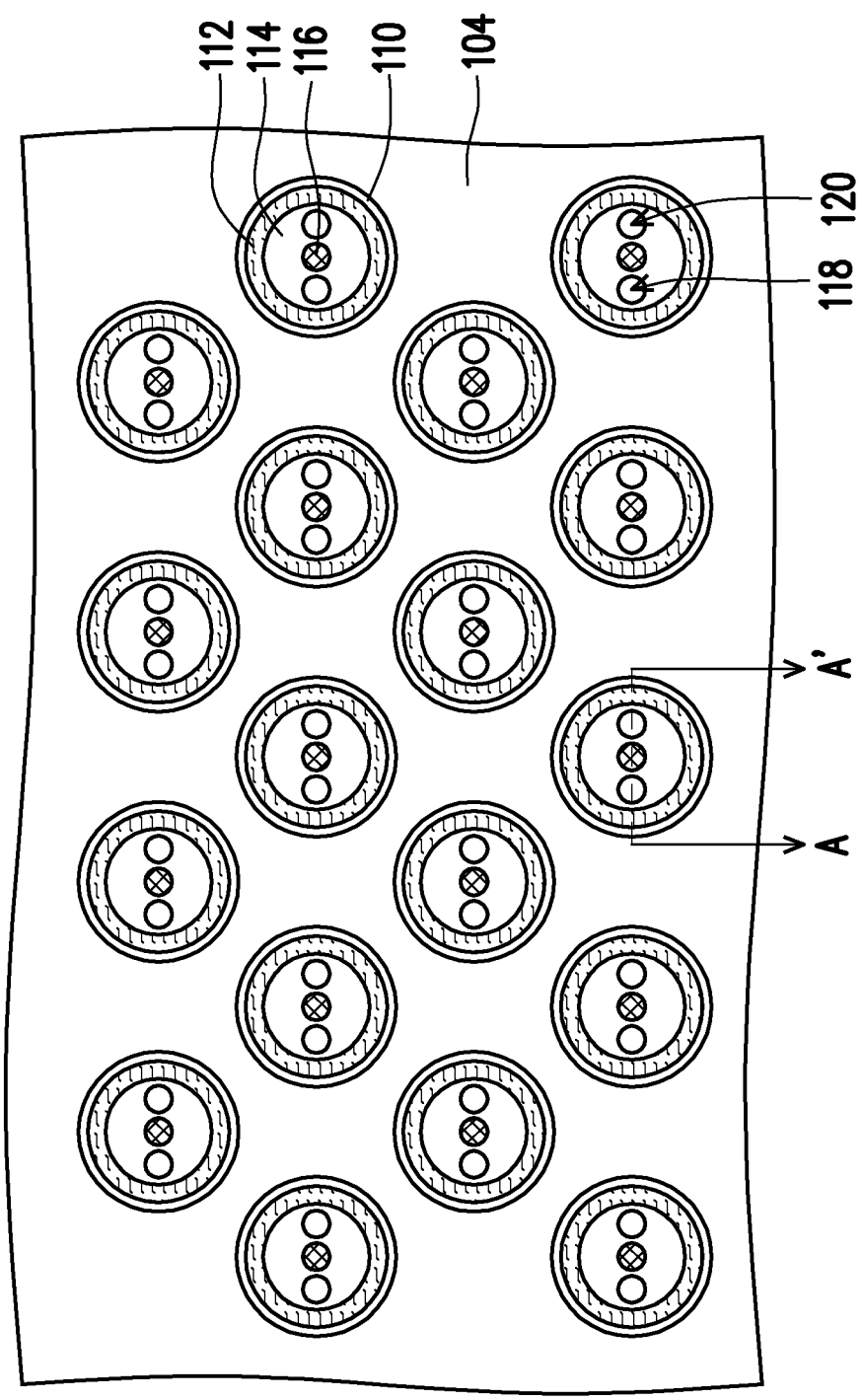
Figure 2C:
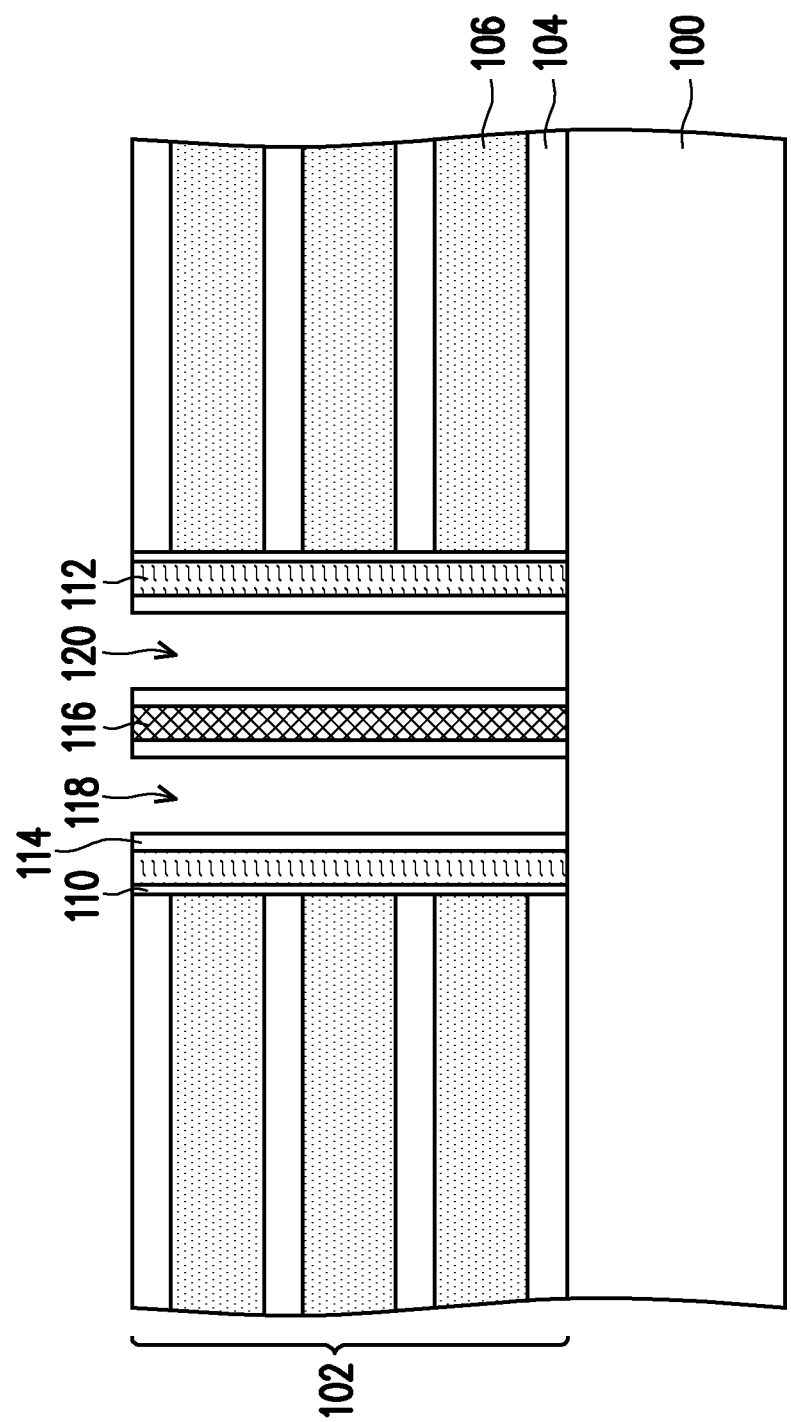

Afterwards, referring to both FIG. 1C and FIG. 2C, an opening 118 and an opening 120 are formed in the insulating layer 114. The opening 118 and the opening 120 expose the dielectric base 100. In the present embodiment, the opening 118 and the opening 120 have a circular profile from a top view, but the invention is not limited thereto. In other embodiments, the opening 118 and the opening 120 may have profiles of other shapes such as a polygon. In the present embodiment, the opening 118 and the opening 120 are respectively formed on two opposite sides of the insulating layer 116 and are not in contact with the insulating layer 116 and the channel layer 112, but the invention is not limited thereto. In other embodiments, the opening 118 and the opening 120 may be in contact with the insulating layer 116 and/or the channel layer 112. The opening 118 and the opening 120 are configured to define a position of a source/drain of the 3D flash memory of the present embodiment.

Figure 1D:
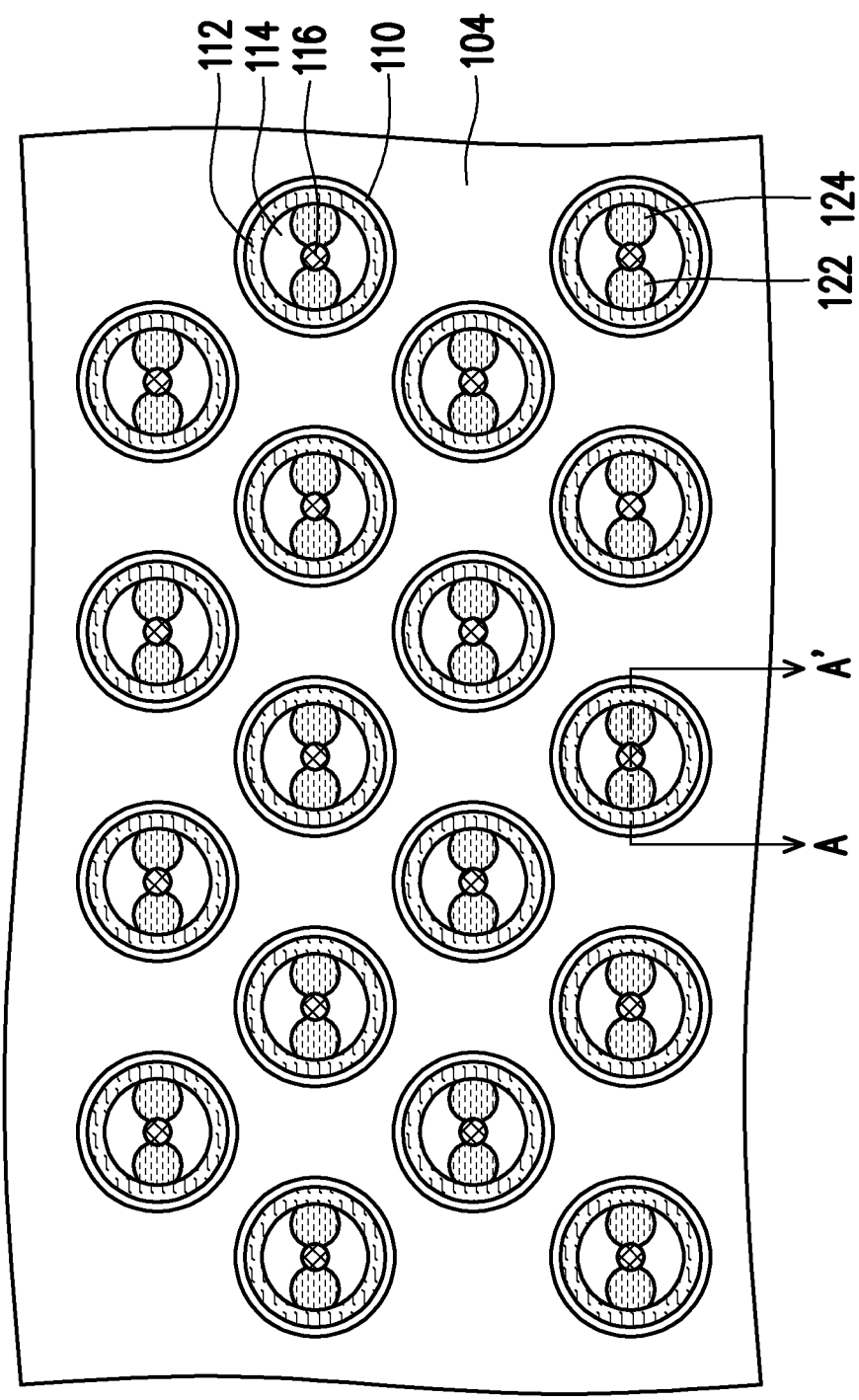
Figure 2D:
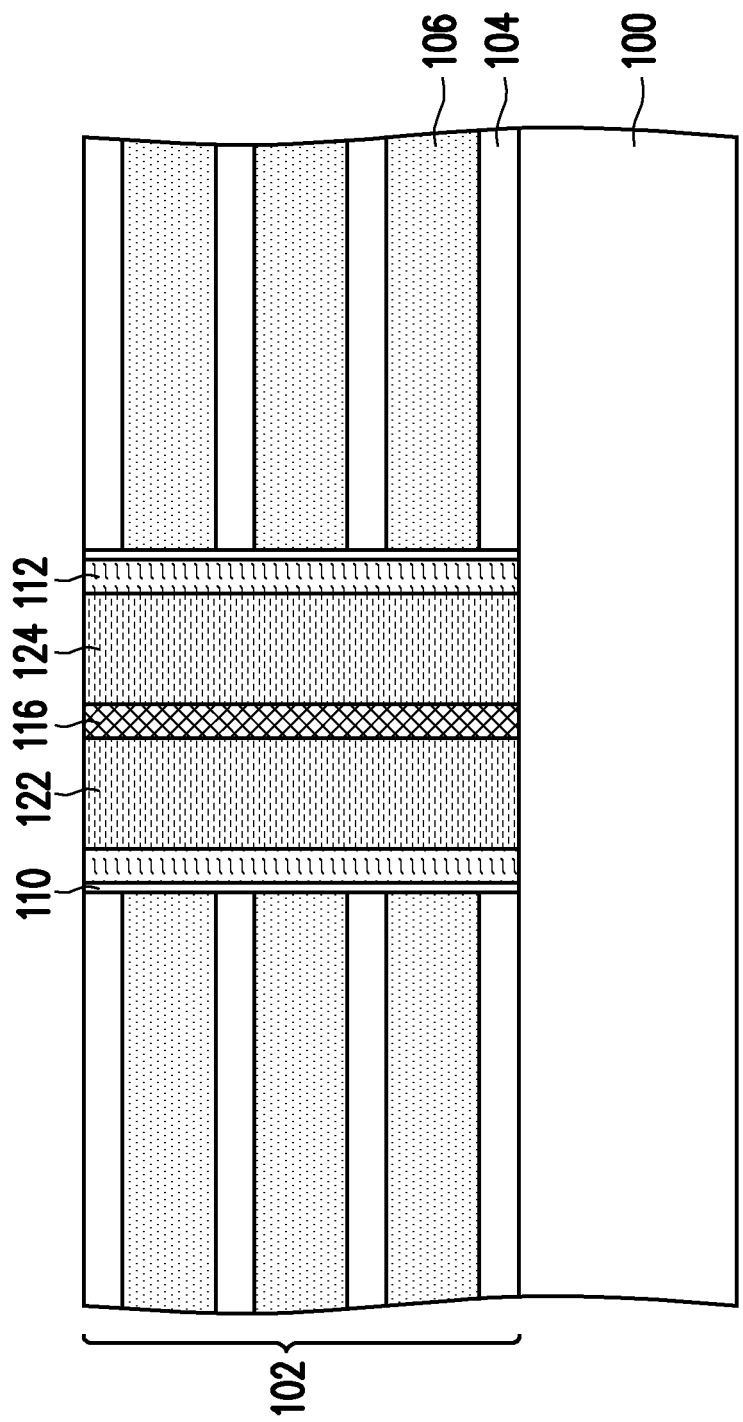

Next, referring to both FIG. 1D and FIG. 2D, sizes of the opening 118 and the opening 120 are enlarged, so that the opening 118 and the opening 120 are respectively in contact with the insulating layer 116 and the channel layer 112. In the present embodiment, a method for enlarging sizes of the opening 118 and the opening 120 is, for example, performing an anisotropic etching process on the opening 118 and the opening 120. In particular, during the anisotropic etching process, an insulating layer 114 (a silicon oxide layer) around the opening 118 and the opening 120 is removed, and the insulating layer 116 (a silicon nitride layer) and the channel layer 112 (a polysilicon layer) may be used as etching stop layers. In this way, the enlarged opening 118 and opening 120 may be in contact with the insulating layer 116 and the channel layer 112. Afterwards, a doped polysilicon layer is formed in the enlarged opening 118 and opening 120 to form a first source/drain pillar 122 and a second source/drain pillar 124 of the 3D flash memory of the present embodiment. In this way, the first source/drain pillar 122 and the second source/drain pillar 124 may be located in a annular channel pillar (the channel layer 112), are separated from each other through an insulating pillar (the insulating layer 116), and are in contact with the channel pillar (the channel layer 112).

Figure 1E:
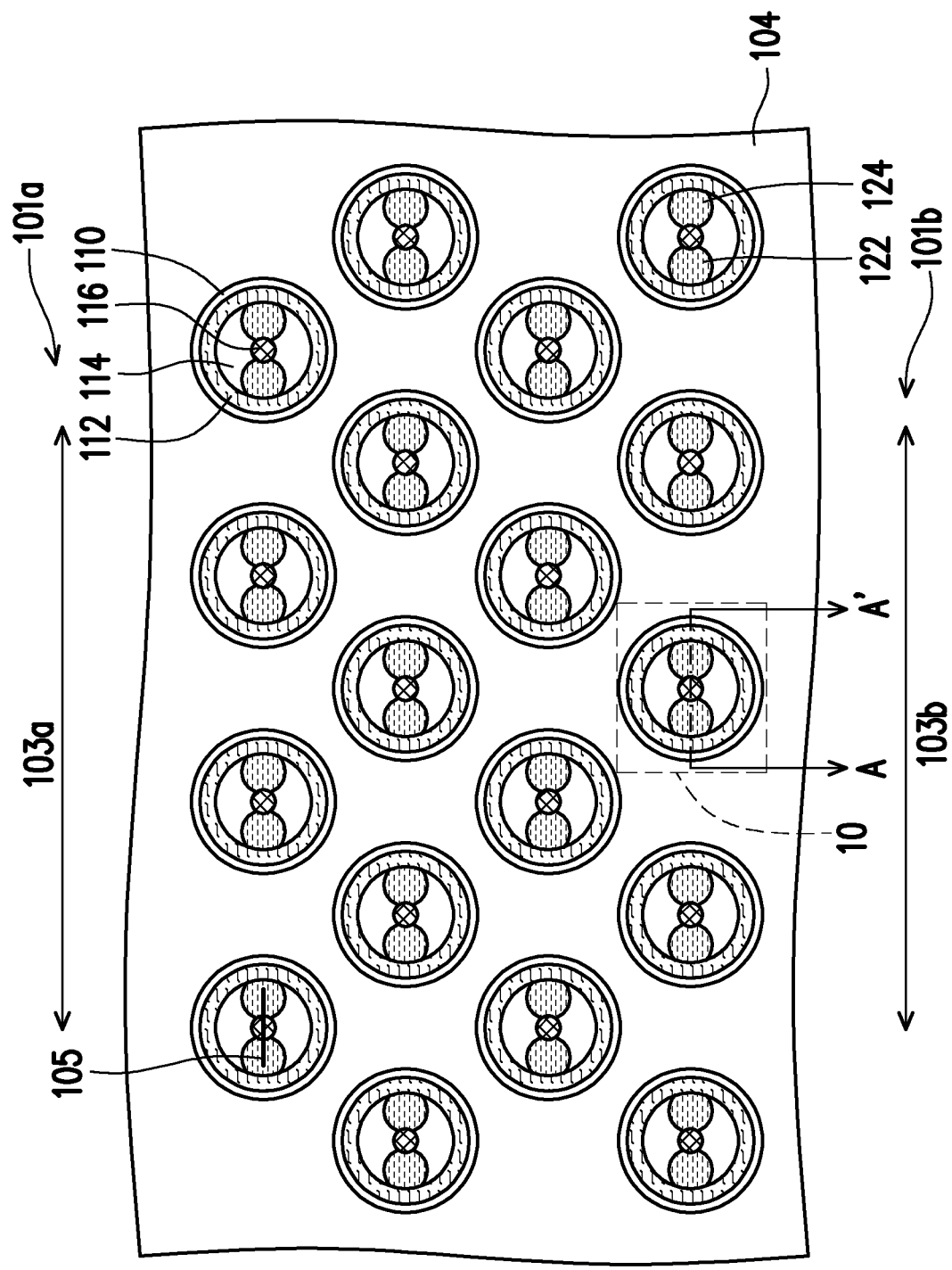
Figure 2E:
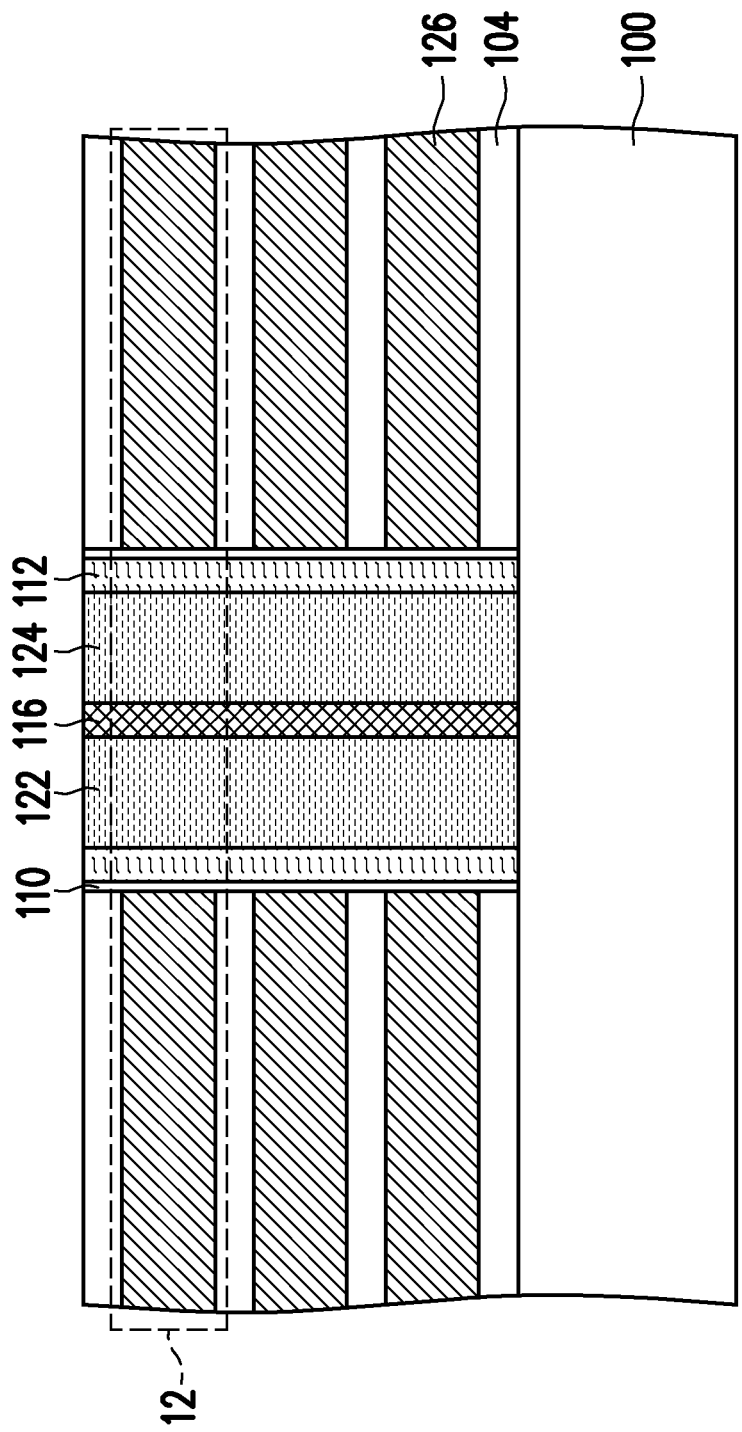

Afterwards, referring to both FIG. 1E and FIG. 2E, a sacrificial layer 106 is removed from a stack structure 102 to form a trench between adjacent insulating layers 104. A method for removing the sacrificial layer 106 is known by those skilled in the art, and the descriptions thereof are omitted herein. After the sacrificial layer 106 is removed, a gate layer 126 is formed in the formed trench. The gate layer 126 is made of, for example, polysilicon, amorphous silicon, tungsten (W), cobalt (Co), aluminum (Al), tungsten silicide ($WSi_x$), or cobalt silicide ($CoSi_x$). In addition, in other embodiments, a buffer layer and a barrier layer may be sequentially formed in the trench before the gate layer 126 is formed. The buffer layer is made of, for example, a material having a high dielectric constant that is greater than 7, such as aluminium oxide ($Al_2O_3$), hafnium oxide ($HfO_2$), lanthanum oxide ($La_2O_5$), transition metal oxide, lanthanide oxide, or a combination thereof. The barrier layer is made of, for example, titanium (Ti), titanium nitride (TiN), tantalum (Ta), tantalum nitride (TaN), or a combination thereof.

In this way, manufacturing of the 3D flash memory 10 of the present embodiment is completed. In the 3D flash memory 10 of the present embodiment, a gate stack structure that is composed of three gate layers 126 is disposed on the dielectric base 100, the annular channel pillar (the channel layer 112) is disposed on the dielectric base 100 and penetrates through the gate stack structure, the first source/drain pillar 122 and the second source/drain pillar 124 are disposed on the dielectric base 100, are located within the channel pillar and penetrate through the gate stack structure, and the charge storage structure 110 is disposed between each gate layer 126 and the channel pillar. In addition, in the annular channel pillar, the first source/drain pillar 122 and the second source/drain pillar 124 are each connected to the channel pillar, and are separated from each other through the insulating pillar.

Figure 10:
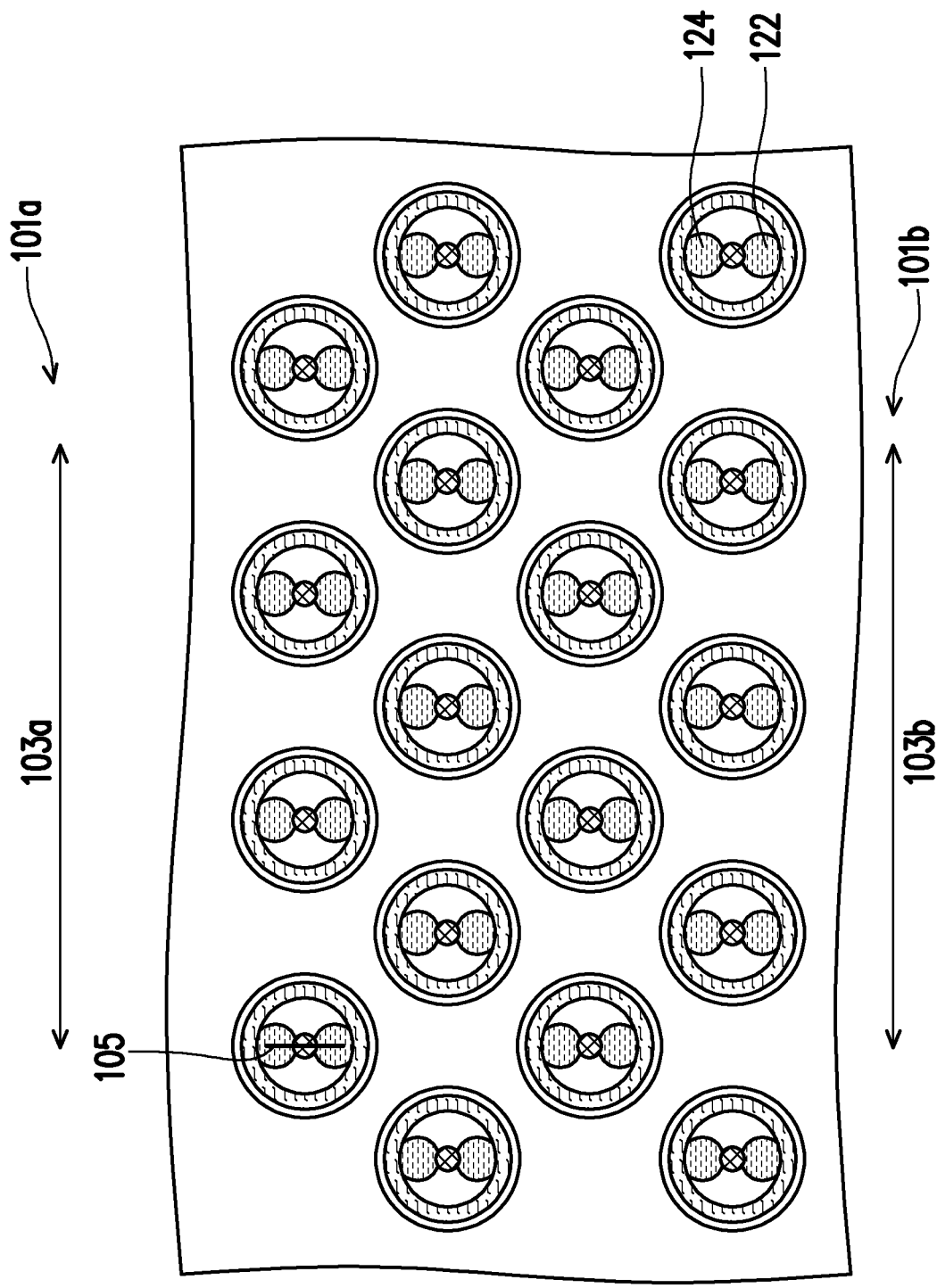
FIG. 10 is a schematic top views of a 3D flash memory according to an another embodiment of the invention.
Figure 11:
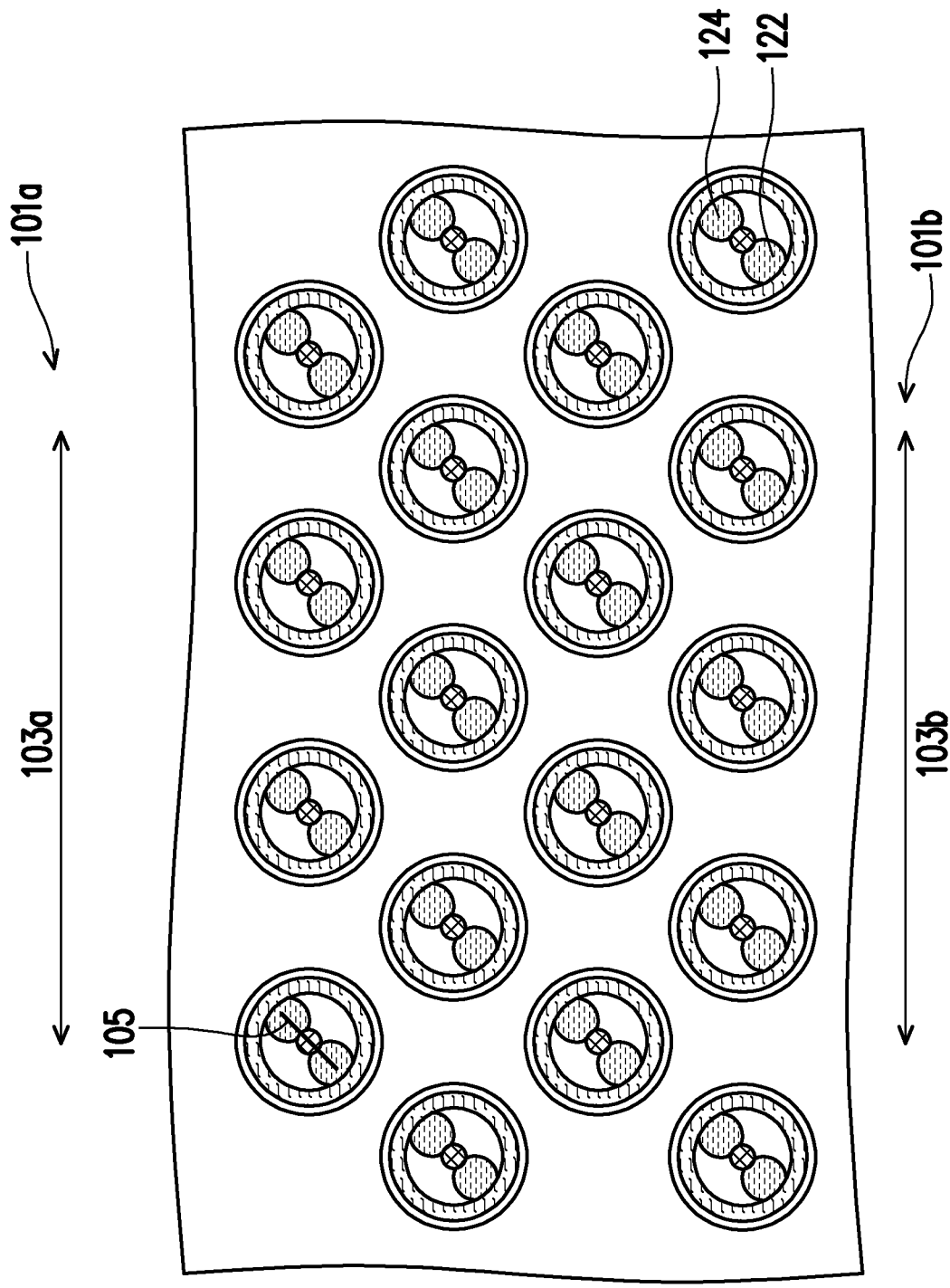
FIG. 11 is a schematic top views of a 3D flash memory according to an another embodiment of the invention.
Figure 12:
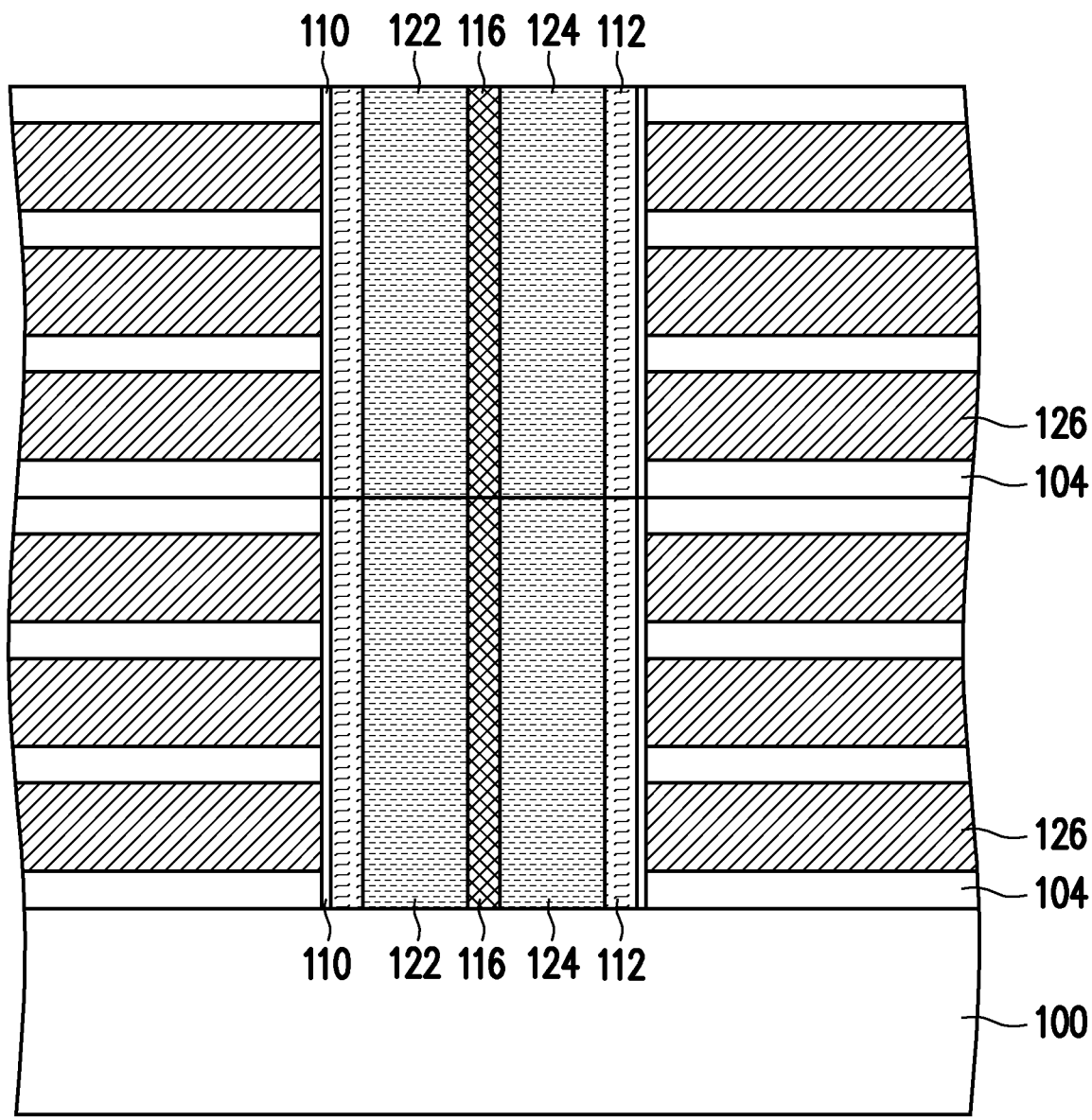
FIG. 12 is a schematic cross-sectional of a 3D flash memory according to an another embodiment of the invention.

In this embodiment, as shown in FIG. 1E, a trench 101a is provided on the left side of the gate stack structure, a trench 101b is provided on the right side of the gate stack structure, and the extension direction 103a of the trench 101a and the extension direction 103b of the trench 101b is parallel. In addition, the connection line 105 between the first source/drain pillar 122 and the second source/drain pillar 124 is perpendicular to the extending directions 103a and 103b, but the present invention is not limited thereto. In other embodiments, the connection line 105 between the first source/drain pillar 122 and the second source/drain pillar 124 may be parallel to the extending directions 103a and 103b (as shown in FIG. 10). Alternatively, an acute angle may be formed between the connecting line 105 between the first source/drain pillar 122 and the second source/drain pillar 124 and the extending directions 103a and 103b (as shown in FIG. 11). The acute angle is preferably 45°.

In addition, in the present embodiment, the 3D flash memory 10 has a plurality of memory units 12, and a plurality of 3D flash memories 10 may be arranged in an array. In particular, as shown in FIG. 1E and FIG. 2E, the 3D flash memory 10 has three memory units 12 that are stacked with each other, and eighteen 3D flash memories 10 are arranged in an array. The 3D flash memories 10 in a first row and a third row are aligned with each other, the 3D flash memories 10 in a second row and a fourth row are aligned with each other, and the 3D flash memories 10 in two adjacent rows are staggered with each other. In addition, quantities, locations, orientations, and spacings of these 3D flash memories 10 are not limited to those shown in FIG. 1E.

Figure 13:
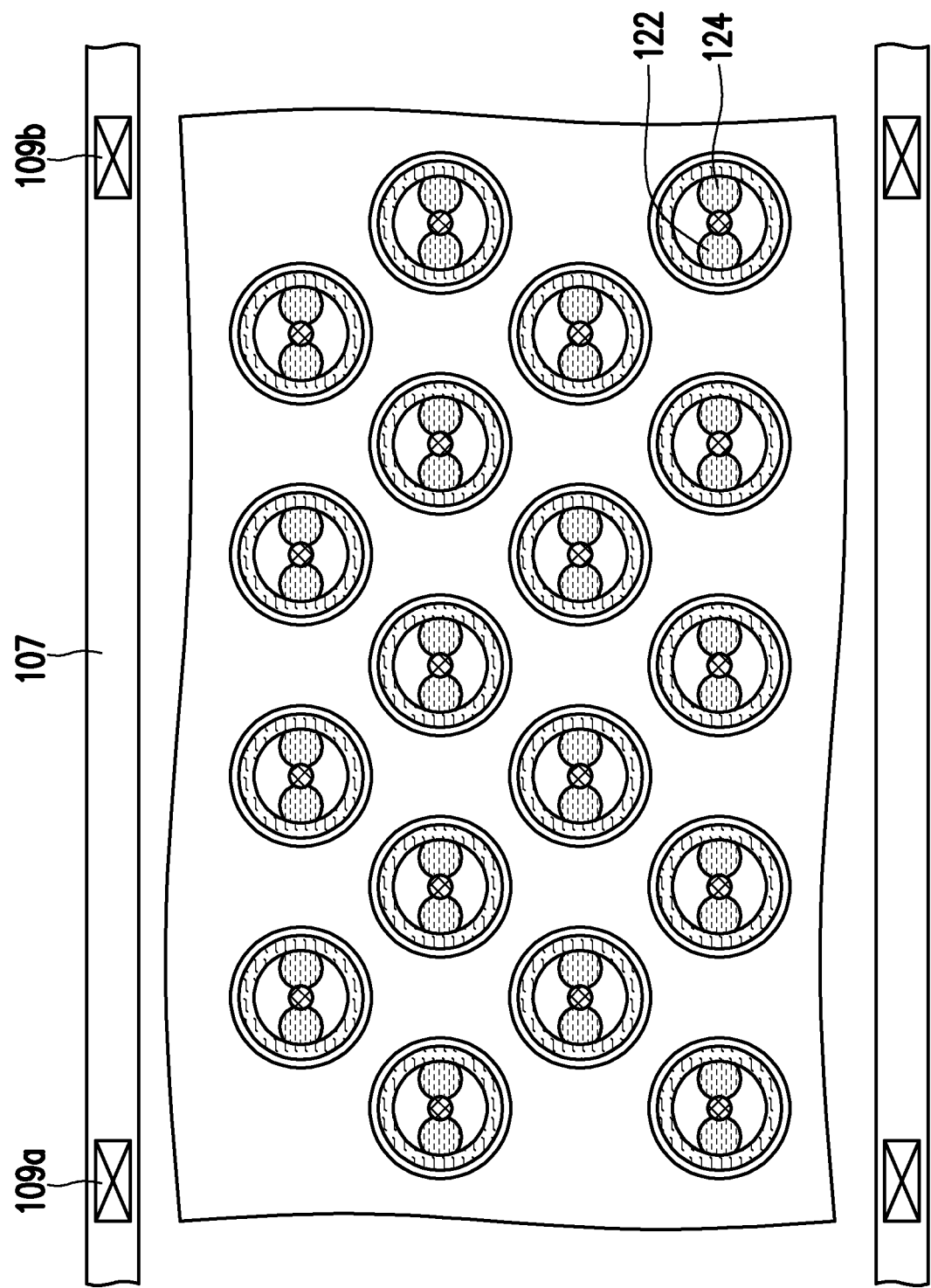
FIG. 13 is a schematic top views of a 3D flash memory according to an another embodiment of the invention.

In addition, in another embodiment, the 3D flash memory of the present invention may further include a conductive layer as a heater to heat the gate stack structure. As shown in FIG. 13, conductive layers 107 are disposed on the dielectric base 100 and is adjacent to the sidewalls of the gate stack structure and extends along the sidewalls of the gate stack structure. In addition, in this embodiment, the conductive layers 107 are disposed adjacent to two opposite sidewalls of the gate stack structure, but the present invention is not limited thereto. In other embodiments, a conductive layer 107 may be provided only adjacent to one sidewall of the gate stack structure according to actual requirements, or conductive layers 107 may be provided around the gate stack structure. In this embodiment, the method of using the conductive layer 107 as a heater is to apply a relatively high voltage and a relatively low voltage to the electrical connection points 109a and 109b at two opposite end portions of the conductive layer 107 to form a voltage difference, respectively. In this way, a current can be generated. When the current passes through the conductive layer 107, the conductive layer 107 generates heat, which can heat the adjacent gate stack structure.

Generally, as an electronic device tends to be miniaturized, a spacing between elements is also reduced. For the array composed of the 3D flash memories 10 of the present embodiment, in order to prevent, caused due to an excessively small spacing between adjacent 3D flash memories 10, difficulty in configuring a bit line that is electrically connected to these 3D flash memories 10, the invention proposes an array layout of the 3D flash memory. The structure shown in FIG. 1E is used as an example for description hereto below.

Figure 3:
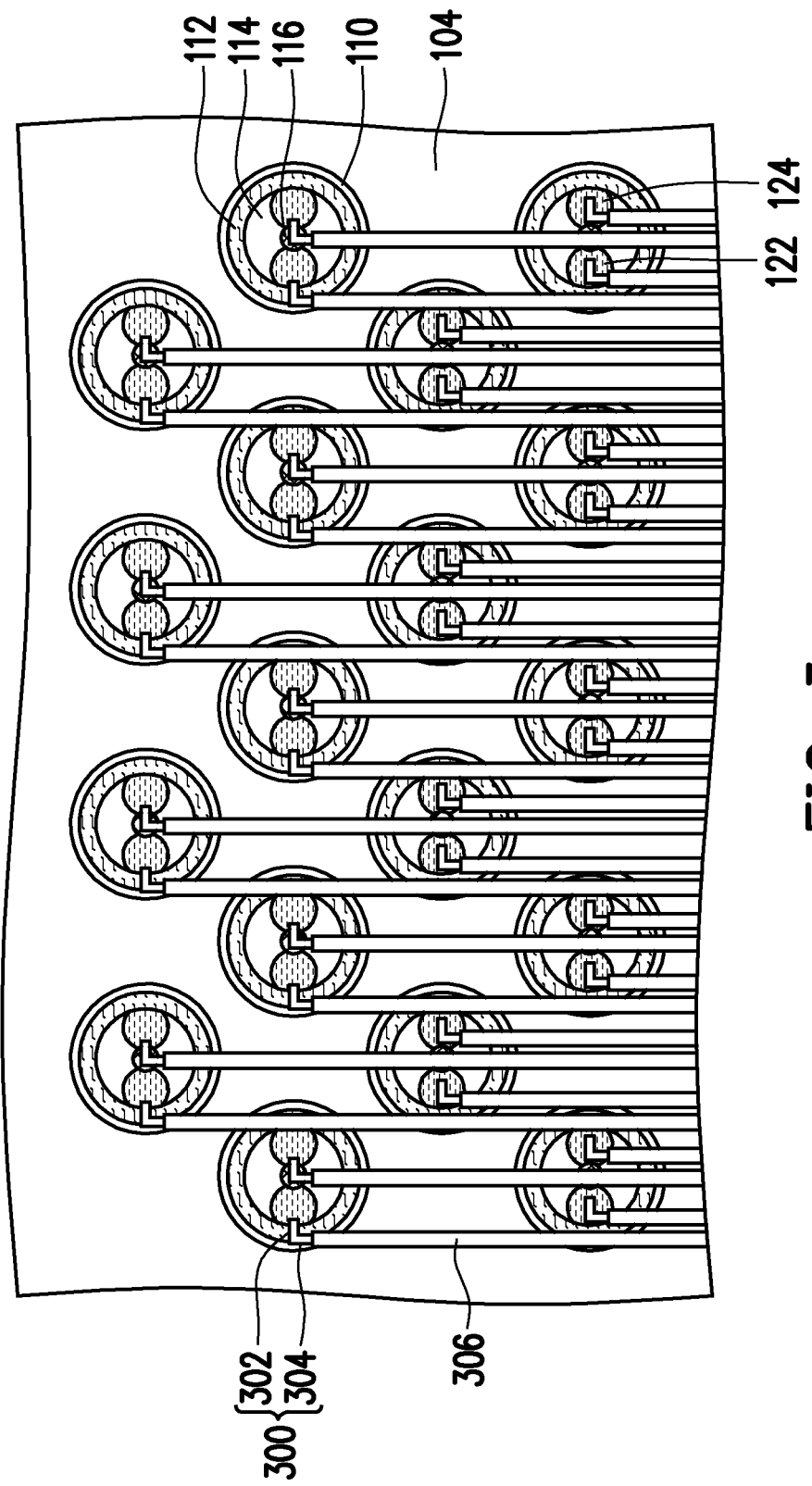
FIG. 3 is a schematic diagram of an array layout of a 3D flash memory according to a first embodiment of the invention.

FIG. 3 is a schematic diagram of an array layout of a 3D flash memory according to a first embodiment of the invention. In FIG. 3, the structure shown in FIG. 1E is used as an example to describe the array layout of the 3D flash memory of the invention. In the following, when the first source/drain pillar 122 is used as the source, the second source/drain pillar 124 is used as the drain, and the conductive line connected to the first source/drain pillar 122 is the source, and a conductive line connected to the second source/drain pillar 124 is the bit line.

Referring to FIG. 3, in order to operate the 3D flash memory 10, after the 3D flash memory 10 is manufactured, conductive lines that are electrically connected to the 3D flash memory 10 are formed above the 3D flash memory 10. In the present embodiment, a conductive line formed on and electrically connected to the first source/drain pillar 122 as a source is used as a source line, a conductive line formed on and electrically connected to the second source/drain pillar 124 as a drain is used as a bit line, and these source lines and bit lines are arranged parallel to each other but are not in contact with each other. However, for the 3D flash memories 10 that are aligned with each other in a first row and a third row, and the 3D flash memories 10 that are aligned with each other in a second row and a fourth row, if a spacing between elements is excessively small, conductive lines that are subsequently formed cannot be arranged parallel to each other but are not in contact with each other.

Therefore, in the present embodiment, after these conductive lines are formed, circuit patterns 300 that are each electrically connected to the first source/drain pillar 122 and the second source/drain pillar 124 are first formed on each 3D flash memory 10. In the present embodiment, these circuit patterns 300 are identical to each other, but the invention is not limited thereto. In other embodiments, these circuit patterns 300 are different from each other. In the present embodiment, the circuit patterns 300 have an L-shaped pattern, but the invention is not limited thereto. In particular, the circuit pattern 300 includes a first portion 302 and a second portion 304. The first portion 302 extends along a row direction of an array of the 3D flash memory 10, and the second portion 304 extends along a column direction of the array of 3D flash memory 10. In addition, the first portion 302 is connected to the first source/drain pillar 122 or the second source/drain pillar 124. After the circuit pattern 300 is formed, a generally known process steps may be performed to form a conductive line 306 that is electrically connected to the circuit pattern 300 through a contact (not depicted) located on the second portion 304.

In the array layout of the 3D flash memory of the present embodiment, the circuit pattern 300 is used and a position of the circuit pattern 300 is adjusted, so that these conductive lines 306 that are electrically connected to the first source/drain pillar 122 and the second source/drain pillar 124 can be arranged parallel to each other but are not in contact with each other. In this way, the conductive lines (source lines and bit lines) may be simply disposed when the spacing between the elements is excessively small, thereby reducing difficulty in layout design.

In addition, in the present embodiment, the source lines and the bit lines are arranged in parallel with each other, but the present invention is not limited thereto. In other embodiments, the above-mentioned architecture may be applied to the array layout of the 3D flash memory where the source lines and the bit lines are interlaced with each other.

An operation of a memory unit 12 in the 3D flash memory 10 is described below.

For the 3D flash memory 10, each memory unit 12 may be separately operated. An operating voltage may be applied to the first source/drain pillar 122, the second source/drain pillar 124, and a gate layer 126 of the memory unit 12, to perform a programming, a reading, or an erasing operation.

When the voltage is applied to the first source/drain pillar 122 and the second source/drain pillar 124, because the first source/drain pillar 122 and the second source/drain pillar 124 are connected to the channel pillar (the channel layer 112), an electron may be transmitted along the channel pillar and stored in the entire charge storage structure 110, that is, a 1-bit operation may be performed on the memory unit 12. In addition, for operations using channel-hot-electron injection or band-to-band tunnelling hot carrier injection, the electron or the hole may be locally trapped in the charge storage structure 110 adjacent to the first source/drain pillar 122 or the second source/drain pillar 124. In this way, a 2-bit operation may be performed on the memory unit 12.

Specially, the 3D flash memory of the invention is not limited to a structure of the 3D flash memory 10, and other various structures are described as follows. In the following embodiments, an element that is the same as that in the first embodiment is represented with a same element symbol, and the descriptions thereof are omitted.

Figure 4:
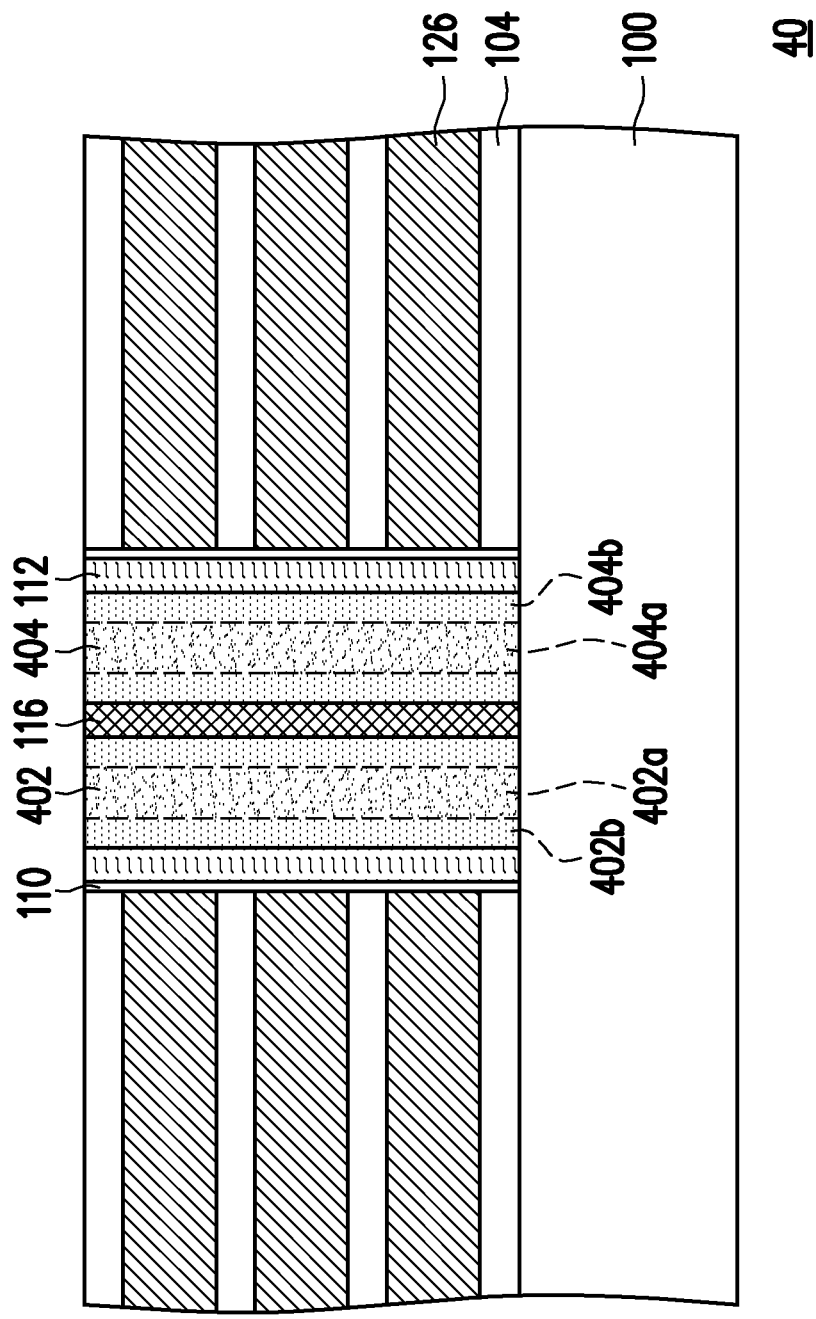
FIG. 4 is a schematic cross-sectional view of a 3D flash memory according to a second embodiment of the invention.

FIG. 4 is a schematic cross-sectional view of a 3D flash memory according to a second embodiment of the invention. A difference between the present embodiment and the first embodiment is described as follows. Referring to FIG. 4, in the present embodiment, a 3D flash memory 40 includes a gate stack structure composed of gate layers 126, a annular channel pillar (a channel layer 112), a first source/drain pillar 402, a second source/drain pillar 404, and a charge storage structure 110. The first source/drain pillar 402 and the second source/drain pillar 404 are, for example, doped polysilicon layers. The first source/drain pillar 402 includes a central portion 402a and a peripheral portion 402b surrounding the central portion 402a, and a doping concentration of the central portion 402a is greater than a doping concentration of the peripheral portion 404b. The second source/drain pillar 404 includes a central portion 404a and a peripheral portion 404b surrounding the central portion 404a, and a doping concentration of the central portion 404a is greater than a doping concentration of the peripheral portion 404b. The doping concentration difference may be used for the junction tuning.

Figure 5:
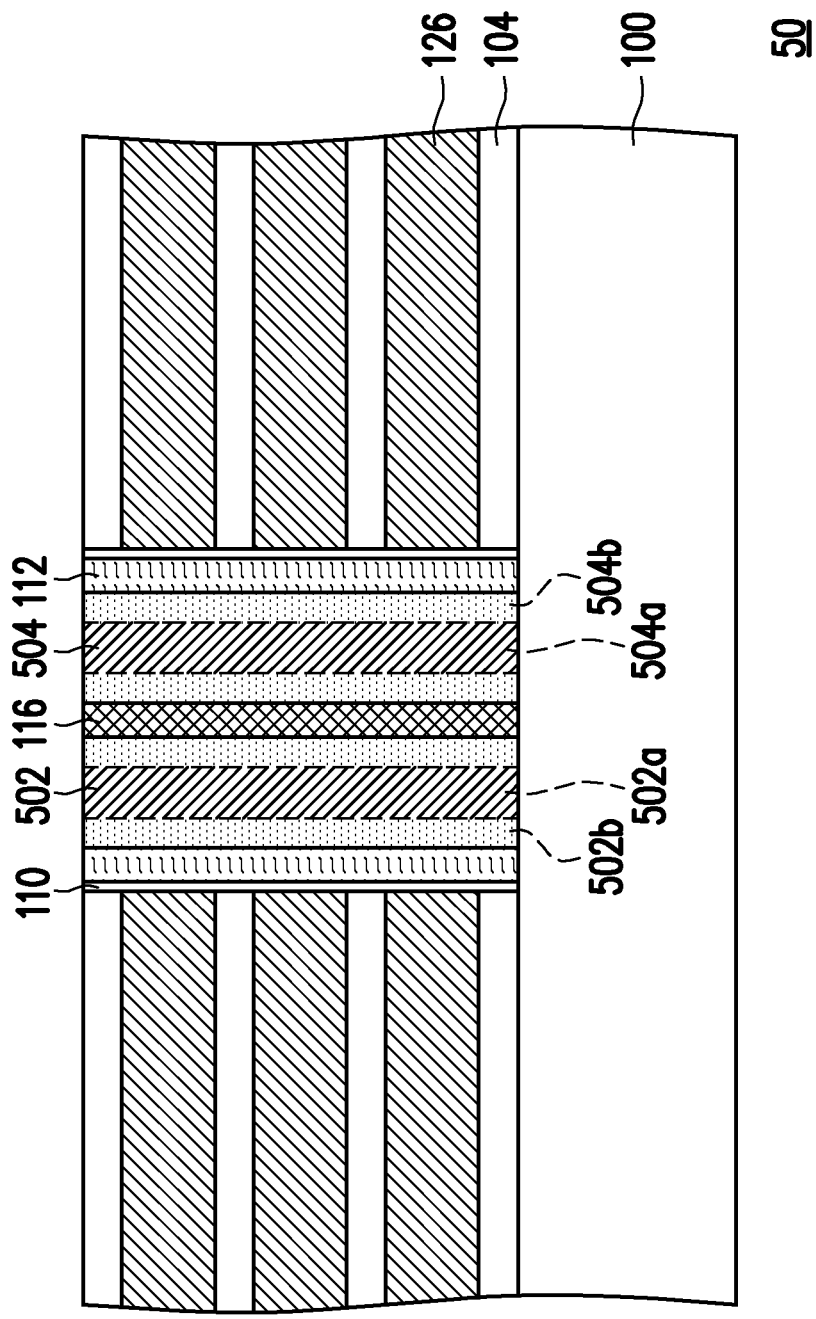
FIG. 5 is a schematic cross-sectional view of a 3D flash memory according to a third embodiment of the invention.

FIG. 5 is a schematic cross-sectional view of a 3D flash memory according to a third embodiment of the invention. A difference between the present embodiment and the first embodiment is described as follows. Referring to FIG. 5, in the present embodiment, a 3D flash memory 50 includes a gate stack structure composed of gate layers 126, a annular channel pillar (a channel layer 112), a first source/drain pillar 502, a second source/drain pillar 504, and a charge storage structure 110. The first source/drain pillar 502 includes a central portion 502a and a peripheral portion 502b surrounding the central portion 502a. The second source/drain pillar 504 includes a central portion 504a and a peripheral portion 504b surrounding the central portion 504a. The peripheral portion 502b and the peripheral portion 504b are, for example, doped polysilicon layers. The central portion 502a and the central portion 504a are, for example, metal silicide layers, which may be made of titanium silicide ($TiSi_x$), cobalt silicide ($CoSi_x$), nickel silicide ($NiSi_x$), or tungsten silicide ($WSi_x$). In this way, the first source/drain pillar 502 and the second source/drain pillar 504 may have smaller resistance values to facilitate efficiency performance of the 3D flash memory.

Figure 6:
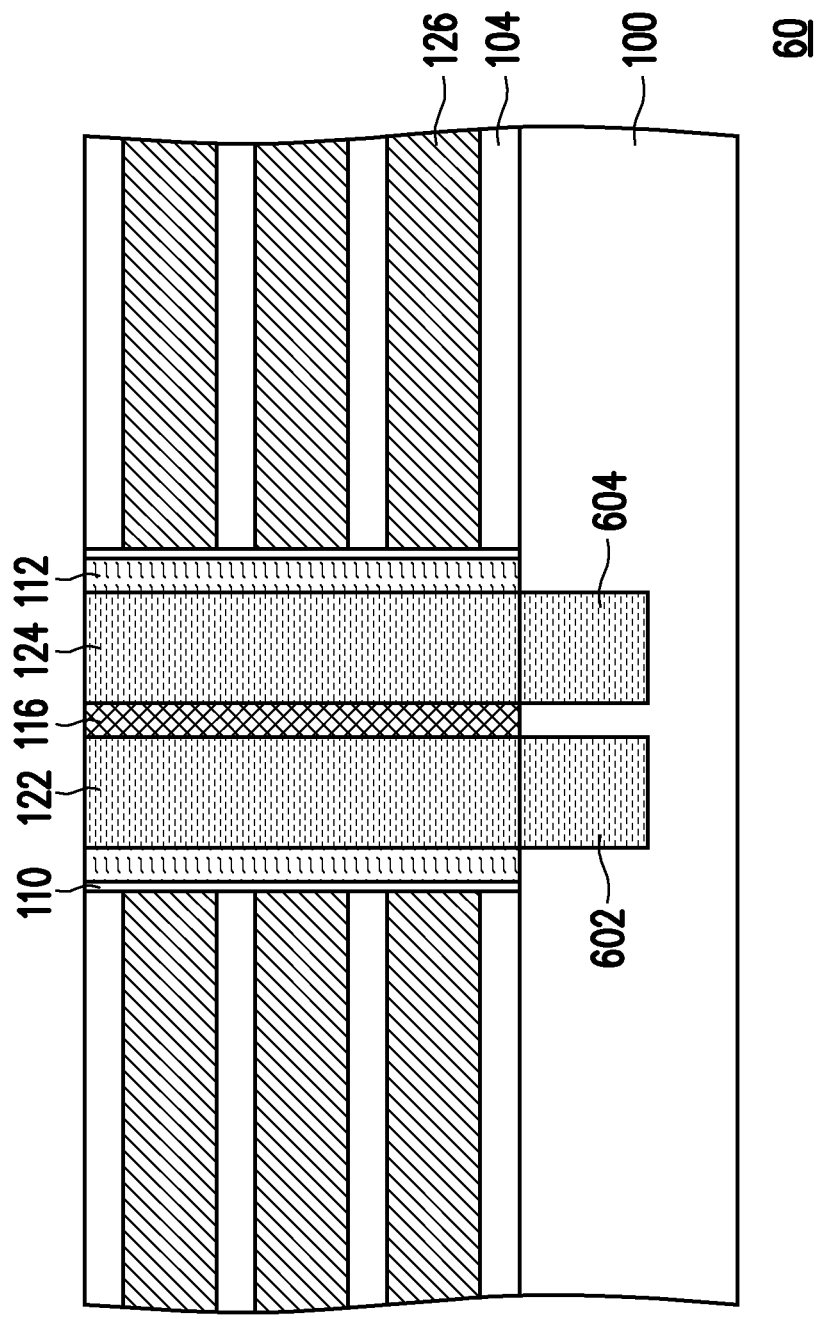
FIG. 6 is a schematic cross-sectional view of a 3D flash memory according to a fourth embodiment of the invention.

FIG. 6 is a schematic cross-sectional view of a 3D flash memory according to a fourth embodiment of the invention. A difference between the present embodiment and the first embodiment is described as follows. Referring to FIG. 6, in the present embodiment, a 3D flash memory 60 includes a gate stack structure composed of gate layers 126, a annular channel pillar (a channel layer 112), a first source/drain pillar 502, a second source/drain pillar 504, a charge storage structure 110, a first buried pillar 602, and a second buried pillar 604. The first buried pillar 602 and the second buried pillar 604 are disposed in a dielectric base 100 and do not penetrate through the dielectric base 100. The first buried pillar 602 is connected to the first source/drain pillar 122, and for example, is aligned with a location of the first source/drain pillar 122, that is, a width of the first buried pillar 602 is, for example, the same as that of the first source/drain pillar 122. The second buried pillar 604 is connected to the second source/drain pillar 124, and for example, is aligned with a location of the second source/drain pillar 124, that is, a width of the second buried pillar 604 is, for example, the same as that of the second source/drain pillar 124. The first buried pillar 602 and the second buried pillar 604 are, for example, polysilicon layers.

In the present embodiment, before a stack structure 102 is formed on the dielectric base 100, the first buried pillar 602 and the second buried pillar 604 are first formed on the dielectric base 100. In this way, in steps shown in FIG. 1C and FIG. 2C, when the opening 118 and the opening 120 are formed through an anisotropic etching process, the first buried pillar 602 and the second buried pillar 604 may be used as etching stop layers to prevent excessive etching. In addition, when the first buried pillar 602 and the second buried pillar 604 are formed, a photomask that is the same as that used for forming the opening 118 and the opening 120 may be used, so that manufacturing costs are not increased.

Figure 7:
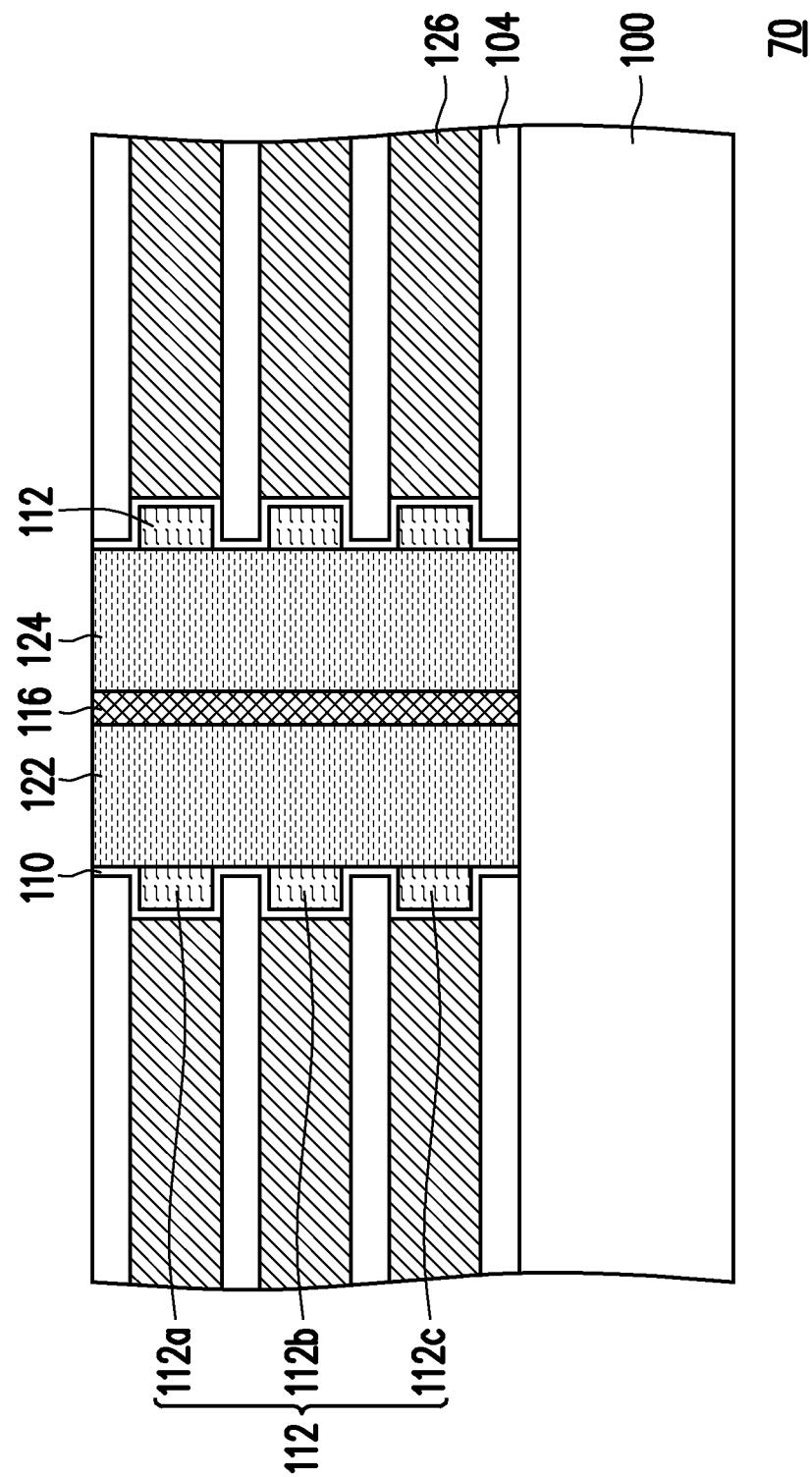
FIG. 7 is a schematic cross-sectional view of a 3D flash memory according to a fifth embodiment of the invention.

FIG. 7 is a schematic cross-sectional view of a 3D flash memory according to a fifth embodiment of the invention. A difference between the present embodiment and the first embodiment is described as follows. Referring to FIG. 7, in the present embodiment, the 3D flash memory 70 includes a gate stack structure composed of gate layers 126, a annular channel pillar (channel layer 112), a first source/drain pillar 122, a second source/drain pillar 124, and a charge storage structure 110. Furthermore, the channel pillar (channel layer 112) is discontinuous in a direction in which the channel pillar extends, and the channel pillar corresponds only to a location of each gate layer 126. "The channel layer 112 is discontinuous in a direction in which the channel layer 112 extends" means that the channel layer 112 is not integral in its extending direction and is divided into a plurality of disconnected portions.

In particular, in the present embodiment, after the opening 108 is formed according to FIG. 1A and FIG. 2A, an etch back process is performed to remove a portion of the sacrificial layer 106, so that a side wall of the sacrificial layer 106 is not flush with the side wall of the insulating layer 104, that is, a trench is formed between adjacent insulating layers 104. Then, in the steps as shown in FIG. 1B and FIG. 2B, the charge storage structure 110 is formed. In this case, in addition to being formed on the inner surface of the opening 108, the charge storage structure 110 is further formed on the side wall of the trench. Next, a channel layer 112 is formed on the charge storage structure 110, and the channel layer 112 fills the trench. Thereafter, an etching process is performed to remove the channel layer 112 outside the trench. In this way, the channel layer 112 is disposed in the trench between the adjacent insulating layers 104. In other words, the channel pillar formed includes a plurality of portions (channel pillar segment 112a, channel pillar segment 112b and channel pillar segment 112c), each of the portions being located in the trench between adjacent insulating layers 104 and corresponding to the location of one gate layer 126. That is, the channel pillar segment 112a, the channel pillar segment 112b and the channel pillar segment 112c are sequentially arranged in the extending direction of the channel pillar and not contacted with each other. Therefore, in the present embodiment, the channel pillar may be deemed to be discontinuous in a direction in which the channel pillar extends.

Figure 8:
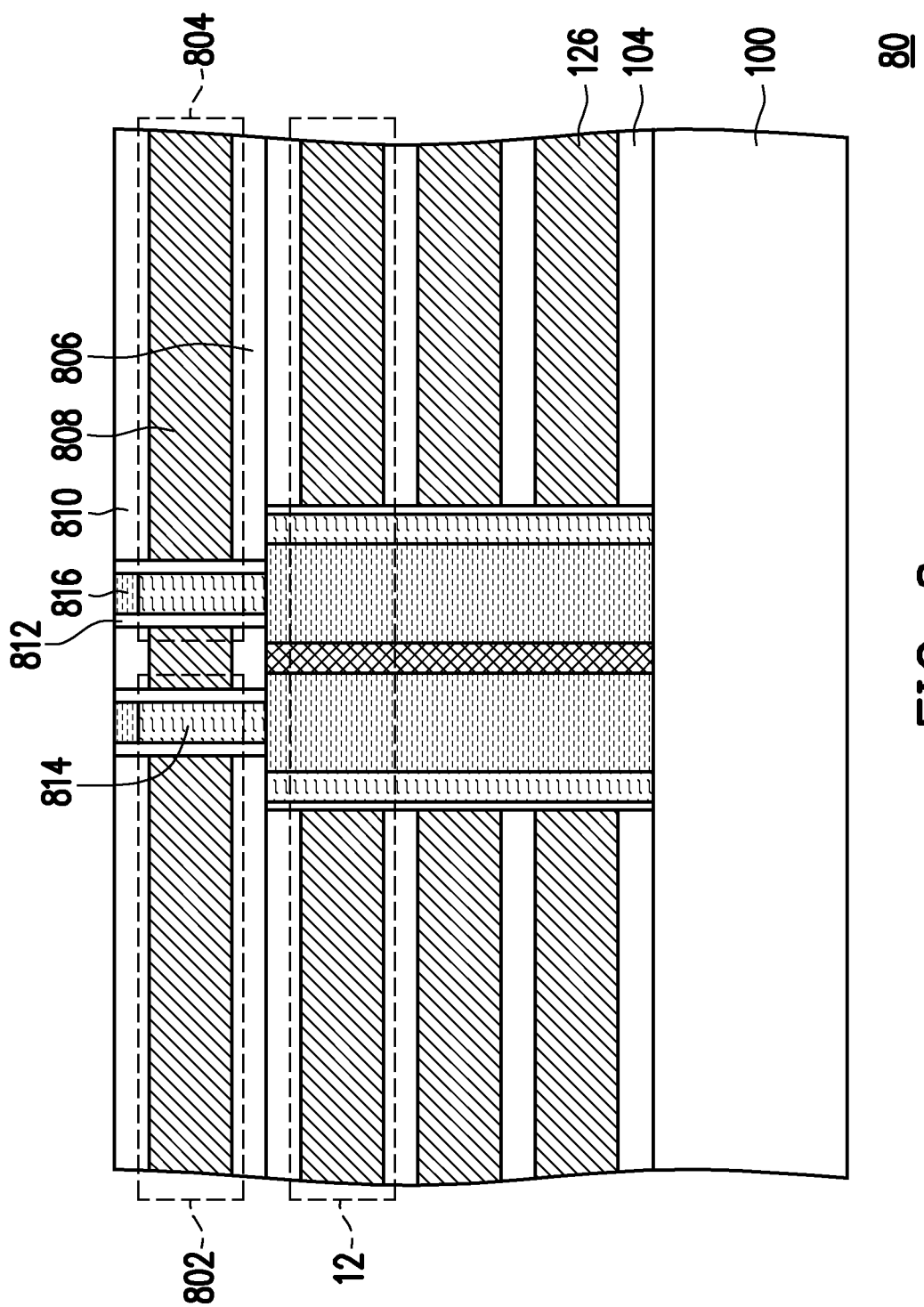
FIG. 8 is a schematic cross-sectional view of a 3D flash memory according to a sixth embodiment of the invention.

FIG. 8 is a schematic cross-sectional view of a 3D flash memory according to a sixth embodiment of the invention. A difference between the present embodiment and the first embodiment is described as follows. Referring to FIG. 8, in the present embodiment, the 3D flash memory 80 includes a gate stack structure composed of gate layers 126, a annular channel pillar (channel layers 112), a first source/drain pillar 122, a second source/drain pillar 124, a charge storage structure 110, a first transistor 802, and a second transistor 804. The first transistor 802 is electrically connected to the first source/drain pillar 122, and the second transistor 804 is electrically connected to the second source/drain pillar 124. In the present embodiment, the first transistor 802 and the second transistor 804 are disposed above a memory unit 12 at a top layer, the first transistor 802 is connected to the first source/drain pillar 122, and the second transistor 804 is connected to the second source/drain pillar 124. The first transistor 802 and the second transistor 804 each include a transistor gate layer 808, a gate insulating layer 812, a transistor channel pillar 814, and a doped region 816.

In particular, in the present embodiment, after the structures as shown in FIG. 1E and FIG. 2E are formed, an insulating layer 806, a transistor gate layer 808, and an insulating layer 810 are sequentially formed on the insulating layer 104 at the top layer. The insulating layer 806 and the transistor gate layer 808 are, for example, silicon oxide layers. The transistor gate layer 808 is, for example, a doped polysilicon layer. Then, an opening exposing the first source/drain pillar 122 and the second source/drain pillar 124 is formed in the insulating layer 806, the transistor gate layer 808, and the insulating layer 810. Next, a gate insulating layer 812 is formed on an inner surface of the opening. The gate insulating layer 812 is, for example, a silicon oxide layer. The opening is then filled with the transistor channel pillar 814. The transistor channel pillar 814 is, for example, an undoped polysilicon layer. Thereafter, a doped region 816 is formed at the top of the transistor channel pillar 814 to serve as a source/drain of the first transistor 802 and the second transistor 804.

In the present embodiment, the 3D flash memory of the present embodiment can be better controlled by using the first transistor 802 connected to the first source/drain pillar 122 and the second transistor 802 connected to the second source/drain pillar 124, and especially the 3D flash memory with more layers of stacked structures can control each memory unit more accurately.

In addition, for the array layout of the 3D flash memory of the embodiment of the invention, because transistors are disposed above the 3D flash memory, and each of the transistors is connected to the first source/drain pillar 122 or the second source/drain pillar 124 of the 3D flash memory, so that a plurality of circuit patterns as shown in FIG. 3 and a plurality of conductive lines arranged parallel to each other without contacting each other are disposed above the transistors. In particular, these circuit patterns (such as the circuit pattern 300 in FIG. 3 including the first portion 302 and the second portion 304) are disposed on the transistors and are each connected to the doped region 816 of the transistor (for example, the first portion 302 is connected to the doped region 816). Moreover, as shown in FIG. 3, the circuit patterns may be electrically connected to the conductive lines (for example, conductive lines 306) via a contact disposed thereon (for example, disposed on the second portion 304).

In the second embodiment to the sixth embodiment, the charge storage structure 110 is formed on the inner surface of the opening 108 after the opening 108 is formed and before the channel layer 112 is formed, but the invention is not limited thereto. In other embodiments, the charge storage structure 110 may alternatively be formed after the sacrificial layer 106 is removed and before the gate layer 126 is formed, which is described below.

Figure 9:
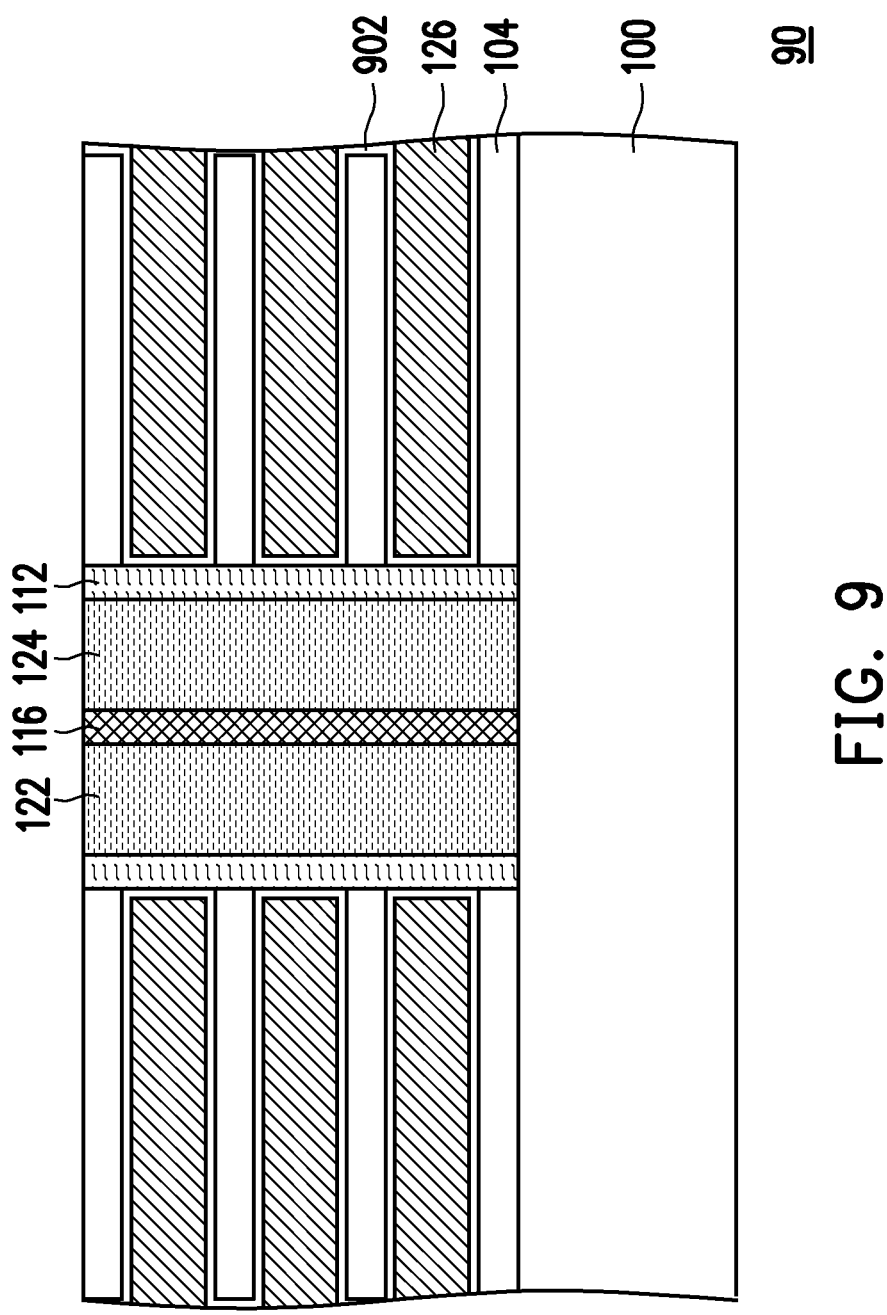
FIG. 9 is a schematic cross-sectional view of a 3D flash memory according to a seventh embodiment of the invention.

FIG. 9 is a schematic cross-sectional view of a 3D flash memory according to a seventh embodiment of the invention. A difference between the present embodiment and the first embodiment is described as follows. Referring to FIG. 9, in the present embodiment, the 3D flash memory 90 includes a gate stack structure composed of gate layers 126, a annular channel pillar (channel layers 112), a first source/drain pillar 122, a second source/drain pillar 124, and a charge storage structure 902. In addition to being located between the gate layer 126 and the channel pillar (channel layers 112), the charge storage structure 902 further covers the upper surface and the lower surface of the gate layer 126, that is, is located between the gate layer 126 and the insulating layer 104.

In particular, in the present embodiment, after the opening 108 is formed as shown in FIG. 1A and FIG. 2A, the charge storage structure 110 is not formed on the inner surface of the opening 108, but the channel layer 112 is formed on the inner surface of the opening 108. In addition, after the sacrificial layer 106 as shown in FIG. 1E and FIG. 2E is removed and before the gate layer 126 is formed, the charge storage structure 902 is conformally formed on the side wall and the bottom of the trench between the adjacent insulating layers 104. Thereafter, a gate layer 126 is formed to fill the trench. In this way, the charge storage structure 902 is disposed between the gate layer 126 and the channel pillar (channel layers 112), and covers the upper surface and the lower surface of the gate layer 126.

In the first embodiment to the seventh embodiment, various structures of the 3D flash memory of the invention are described, but the invention is not limited thereto. In other embodiments, the structure of the 3D flash memory may also be achieved by combining two or more of the first embodiment to the seventh embodiment.

In addition, when more layers of memory unit stack structures are required for high integration and high area utilization, a plurality of 3D flash memories of the invention may be stacked. For example, after the 3D flash memory 10 as shown in FIG. 1E and FIG. 2E is formed, the manufacturing steps of the 3D flash memory 10 may be repeated again one or more times, so that another or more 3D flash memories 10 are stacked on the 3D flash memory 10. In this way, complexity of manufacturing a multi-layer 3D flash memory can be effectively reduced. In this case, the connection between the upper 3D flash memory and the lower 3D flash memory can be achieved by connecting the source/drain pillar of the upper 3D flash memory with the source/drain pillar of the lower 3D flash memory. Since the source/drain pillar in the 3D flash memory of the present invention has a larger size compared to other components, the upper 3D flash memory and the lower 3D flash memory can be easily aligned, and thus mismatch is less likely to occur and the channel pillar of the upper 3D flash memory and the channel pillar of the lower 3D flash memory may therefore not be completely aligned.

Based on the foregoing, in the 3D flash memory of the invention, the annular channel pillar is disposed in the gate stack structure, and two source/drain pillars are disposed in the channel pillar and connected to the channel pillar. In this way, the 3D flash memory of the invention may be used to generate a 1-bit operation or a 2-bit operation by using different operation methods. In addition, the 3D flash memory of the invention may have high integration and high area utilization accordingly, and meets the requirement of fast operation speed.

Although the invention has been described with reference to the above embodiments, the embodiments are not intended to limit the invention. A person of ordinary skill in the art may make variations and improvements without departing from the spirit and scope of the invention. Therefore, the protection scope of the invention should be subject to the appended claims.

What is claimed is:

1. A 3D flash memory, comprising:
    a gate stack structure disposed on a dielectric base, and comprising a plurality of gate layers electrically insulated from each other;
    a annular channel pillar disposed on the dielectric base and penetrating through the gate stack structure;
    a first source/drain pillar and a second source/drain pillar disposed on the dielectric base, located within the channel pillar and penetrating through the gate stack structure, wherein the first source/drain pillar and the second source/drain pillar are physically separated from each other and are each connected to the channel pillar;
    a charge storage structure disposed between each of the plurality of gate layers and the channel pillar;
    an insulating pillar disposed between the first source/drain pillar and the second source/drain pillar, wherein the first source/drain pillar and the second source/drain pillar are physically separated from each other and electrically isolated by the insulating pillar; and
    an insulating layer disposed within the channel pillar, wherein a material of the insulating layer is different from a material of the insulating pillar.

2. The 3D flash memory according to claim 1, wherein the first source/drain pillar and the second source/drain pillar each comprise a central portion and a peripheral portion surrounding the central portion, and a doping concentration of the central portion is greater than that of the peripheral portion.

3. The 3D flash memory according to claim 1, wherein the first source/drain pillar and the second source/drain pillar each comprise a central portion and a peripheral portion surrounding the central portion, and the central portion comprises a metal silicide layer.

4. The 3D flash memory according to claim 1, further comprising a first buried pillar and a second buried pillar that are disposed in the dielectric base, wherein the first buried pillar is connected to the first source/drain pillar, and the second buried pillar is connected to the second source/drain pillar.

5. The 3D flash memory according to claim 1, wherein the charge storage structure covers an upper surface and a lower surface of each of the plurality of gate layers.

6. The 3D flash memory according to claim 1, wherein the charge storage structure covers an outer surface of the channel pillar.

7. The 3D flash memory according to claim 1, wherein the channel pillar is continuous in a direction in which the channel pillar extends.

8. The 3D flash memory according to claim 1, wherein the channel pillar is discontinuous in a direction in which the channel pillar extends, and the channel pillar corresponds only to a location of each of the plurality of gate layers.

9. The 3D flash memory according to claim 8, wherein the channel pillar comprises a plurality of channel pillar segments sequentially arranging in the extending direction of the channel pillar and not contacting with each other, and the plurality of channel pillar segments each correspond to a position of one of the plurality of gate layers.

10. The 3D flash memory according to claim 1, further comprising a first transistor and a second transistor, wherein the first transistor is electrically connected to the first source/drain pillar, and the second transistor is electrically connected to the second source/drain pillar.

11. The 3D flash memory according to claim 10, wherein the first transistor and the second transistor are composed of a transistor gate layer, a first transistor channel pillar, a second transistor channel pillar, a first gate insulating layer, and a second gate insulating layer, wherein
    the transistor gate layer is stacked on the gate stack structure and electrically insulated from the gate stack structure,
    the first transistor channel pillar penetrates through the transistor gate layer and is connected to the first source/drain pillar,
    the second transistor channel pillar penetrates through the transistor gate layer and is connected to the second source/drain pillar,
    the first gate insulating layer is disposed between the first transistor channel pillar and the transistor gate layer,
    the second gate insulating layer is disposed between the second transistor channel pillar and the transistor gate layer,
    one end of the first transistor channel pillar opposite to the first source/drain pillar has a first doped region, and
    one end of the second transistor channel pillar opposite to the second source/drain pillar has a second doped region.

12. The 3D flash memory according to claim 1, wherein charges are locally trapped in the charge storage structure adjacent to the first source/drain pillar and/or the second source/drain pillar.

13. The 3D flash memory according to claim 1, wherein a plurality of the 3D flash memories are stacked with each other, and the first source/drain pillar of the upper 3D flash memory is connected to the first source/drain pillar of the lower 3D flash memory, and the second source/drain pillar of the upper 3D flash memory is connected to the second source/drain pillar of the lower 3D flash memory.

14. The 3D flash memory according to claim 1, wherein trenches are arranged in parallel at opposite sides of the gate stack structure, and from a top view direction, a connection line between the first source/drain pillar and the second source/drain pillar is parallel or perpendicular to the extending direction of the trenches.

15. The 3D flash memory according to claim 1, wherein trenches are arranged in parallel at opposite sides of the gate stack structure, and from a top view direction, an acute angle is formed between a connection line between the first source/drain pillar and the second source/drain pillar and the extending direction of the trenches.

16. The 3D flash memory according to claim 1, further comprising a conductive layer disposed on the dielectric base and adjacent to at least one side wall of the gate stack structure, wherein the conductive layer extends along the at least one side wall of the gate stack structure, and each of two opposite end portions of the conductive layer has an electrical connection point in an extending direction of the conductive layer.

17. An array layout of a 3D flash memory, comprising:
a plurality of 3D flash memories according to claim 1 arranged on the dielectric base in an array;
a plurality of circuit patterns each electrically connected to one of the first source/drain pillar and the second source/drain pillar that are of the plurality of 3D flash memories; and
a plurality of conductive lines each electrically connected to a corresponding one of the plurality of circuit patterns via a contact, wherein the plurality of conductive lines are arranged parallel to each other.

18. The array layout of the 3D flash memory according to claim 17, wherein each of the plurality of circuit patterns comprises:
a first portion extending along a row direction of the array, and connected to one of the first source/drain pillar and the second source/drain pillar; and
a second portion extending along a column direction of the array,
wherein the contact is disposed on the second portion, and the plurality of conductive lines extend along the column direction.

19. The array layout of the 3D flash memory according to claim 17, wherein the plurality of conductive lines comprises source lines or bit lines.

* * * * *

UNITED STATES PATENT AND TRADEMARK OFFICE
CERTIFICATE OF CORRECTION

| | |
|---|---|
| PATENT NO. | : 11,678,486 B2 |
| APPLICATION NO. | : 16/784167 |
| DATED | : June 13, 2023 |
| INVENTOR(S) | : Hang-Ting Lue et al. |

It is certified that error appears in the above-identified patent and that said Letters Patent is hereby corrected as shown below:

On the Title Page

Column 1, Item (73) Assignee should read: MACRONIX INTERNATIONAL CO., LTD.

Signed and Sealed this
Eighth Day of August, 2023

Katherine Kelly Vidal
*Director of the United States Patent and Trademark Office*